US012635227B2

(12) United States Patent
Ohara et al.

(10) Patent No.: US 12,635,227 B2
(45) Date of Patent: May 19, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Takahiro Ohara, Tokyo (JP); Koichi Arai, Tokyo (JP); Yasunori Yamashita, Tokyo (JP); Hideyuki Yashima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 419 days.

(21) Appl. No.: 18/347,146

(22) Filed: Jul. 5, 2023

(65) Prior Publication Data

US 2024/0088287 A1 Mar. 14, 2024

(30) Foreign Application Priority Data

Sep. 9, 2022 (JP) ................................. 2022-143938

(51) Int. Cl.
*H10D 84/00* (2025.01)
*H10D 30/01* (2025.01)
*H10D 64/01* (2025.01)

(52) U.S. Cl.
CPC ....... *H10D 84/141* (2025.01); *H10D 30/0291* (2025.01); *H10D 64/01* (2025.01)

(58) Field of Classification Search
CPC .. H10D 84/141; H10D 30/0291; H10D 64/01; H10D 30/665; H10D 62/109; H10D 62/105; H10D 30/025; H10D 30/635; H10D 84/0135; H10D 84/0144; H10D 84/0149; H10D 84/016; H10D 84/038; H10D 84/81
See application file for complete search history.

(56) References Cited

U.S. PATENT DOCUMENTS

| | | | | |
|---|---|---|---|---|
| 7,940,561 B2 * | 5/2011 | Shiba | ..................... | H10B 41/40 |
| | | | | 365/185.26 |
| 9,012,277 B2 * | 4/2015 | Flachowsky | ......... | H10D 84/038 |
| | | | | 257/190 |
| 10,205,006 B2 * | 2/2019 | Amo | ...................... | H10B 43/27 |
| 10,903,354 B2 * | 1/2021 | Nakazawa | ........... | H10D 12/481 |
| 12,100,763 B2 * | 9/2024 | Urakami | .............. | H10D 62/106 |
| 2016/0035880 A1 * | 2/2016 | Tamaki | .................... | H10D 8/50 |
| | | | | 257/329 |

(Continued)

FOREIGN PATENT DOCUMENTS

JP 2019-102705 A 6/2019

*Primary Examiner* — Shahed Ahmed
*Assistant Examiner* — Khatib A Rahman
(74) *Attorney, Agent, or Firm* — Rimon P.C.

(57) ABSTRACT

A semiconductor device includes a semiconductor substrate, a first insulating film formed on an upper surface of the semiconductor substrate in an outer peripheral region so as to surround a cell region in plan view, and a resistive element formed on the first insulating film so as to surround the cell region in plan view. A second insulating film having a thickness thinner than that of the first insulating film is formed on the upper surface of the semiconductor substrate in the outer peripheral region. A dummy pattern is formed from a portion over the second insulating film to a portion over the first insulating film so as to cover a step occurring between the second insulating film and the first insulating film.

9 Claims, 19 Drawing Sheets

(56)　　　　　　References Cited

U.S. PATENT DOCUMENTS

| 2016/0064389 A1* | 3/2016 | Mihara ................. H10D 30/69 |
| | | 257/314 |
| 2016/0268445 A1* | 9/2016 | Amo .................... H10D 30/696 |
| 2017/0278750 A1* | 9/2017 | Shinohara ......... H01L 21/76895 |
| 2018/0233587 A1* | 8/2018 | Amo ....................... H10D 64/01 |
| 2019/0326311 A1* | 10/2019 | Chakihara .......... H10D 30/0227 |
| 2019/0341308 A1* | 11/2019 | Urakami .......... H01L 21/02104 |

* cited by examiner

*FIG. 7*

SEMICONDUCTOR DEVICE AND METHOD OF MANUFACTURING THE SAME

CROSS-REFERENCE TO RELATED APPLICATIONS

The disclosure of Japanese Patent Application No. 2022-143938 filed on Sep. 9, 2022, including the specification, drawings and abstract is incorporated herein by reference in its entirety.

BACKGROUND

The present disclosure relates to a semiconductor device and method of manufacturing the same, and more particularly, to a semiconductor device and method of manufacturing the same including a resistive element at an outer periphery of a cell region.

In a semiconductor device including a cell region in which a high withstand voltage MOSFET (Metal Oxide Semiconductor Field Effect Transistor) is formed, a resistive element may be provided in an outer peripheral region surrounding the cell region in order to improve the withstand voltage of the outer peripheral region.

Here, there are disclosed techniques listed below. [Patent Document 1] Japanese Unexamined Patent Application Publication No. 2019-102705

For example, Patent Document 1 discloses a semiconductor device including a resistive field plate, as a resistive element, around a central region in which a semiconducting element such as IGBT (Insulated Gate Bipolar Transistor) is formed.

SUMMARY

Since a high withstand voltage of, for example, 1000 volt or more is required in the outer peripheral region, the resistive element is formed on an insulating film of, for example, 1 micrometer or more. Therefore, a large step occurs between a semiconductor substrate and the insulating film. The resistive element is formed by depositing a conductive film such as a polycrystalline silicon film and also by patterning the conductive film. In this patterning, since an anisotropic etching process is performed on the conductive film, a part of the conductive film is easily left in a sidewall shape at the stepped portion comprised of the semiconductor substrate and the insulating film. If the remaining conductive film is peeled off during a subsequent manufacturing process, the conductive film remains as a foreign matter and causes a defect or the like. Therefore, there is a problem that the reliability of the semiconductor device is lowered and also the manufacturing yield of the semiconductor device is lowered.

A main purpose of the present application is to provide a technique capable of suppressing generation of the foreign matter. This improves the reliability of the semiconductor device and also suppresses a decrease in the manufacturing yield. Other objects and novel features will become apparent from the description of this specification and the accompanying drawings.

The typical ones of the embodiments disclosed in the present application will be briefly described as follows.

A semiconductor device according to one embodiment includes: a cell region in which a MOSFET is formed; and an outer peripheral region surrounding the cell region in plan view. The semiconductor device further includes: a semiconductor substrate of a first conductivity type; a first insulating film formed on an upper surface of the semiconductor substrate in the outer peripheral region so as to surround the cell region in plan view; and a resistive element formed on the first insulating film so as to surround the cell region in plan view. Here, a second insulation film having a thickness thinner than a thickness of the first insulation film is formed on the upper surface of the semiconductor substrate in the outer peripheral region. Also, a first dummy pattern is formed from a portion over the second insulating film to a portion over the first insulating film so as to cover a step occurring between the second insulating film and the first insulating film.

A method of manufacturing a semiconductor device according to one embodiment is a method of manufacturing a semiconductor device including a cell region in which a MOSFET is formed and an outer peripheral region surrounding the cell region in plan view. The method further includes steps of: (a) providing a semiconductor substrate of a first conductivity type, the semiconductor substrate having an upper surface and a lower surface; (b) after the step of (a), forming a first insulating film on the upper surface of the semiconductor substrate in the outer peripheral region so as to surround the cell region in plan view; (c) after the step of (b), forming a second insulating film having a thickness thinner than a thickness of the first insulating film on the upper surface of the semiconductor substrate in the outer peripheral region; (d) after the step of (c), forming a first conductive film on each of the first insulating film and the second insulating film so as to cover a step occurring between the second insulating film and the first insulating film; (e) after the step of (d), selectively removing a portion of the first conductive film on the first insulating film so as to remain the first conductive film covering the step; (f) after the step of (e), forming a third insulating film on each of the first insulating film and the first conductive film; (g) after the step of (f), forming a second conductive film on the third insulating film; (h) after the step of (g), by patterning the second conductive film, forming a resistive element on the first insulating film so as to surround the cell region in plan view; and (i) after the step of (h), selectively removing a portion of the third insulating film, a portion of the first conductive film and a portion of the second insulating film on the upper surface of the semiconductor substrate. Here, the first conductive film left in the outer peripheral region after the step of (i) composes a first dummy pattern. Also, the first dummy pattern is formed from a portion over the second insulating film to a portion over the first insulating film so as to cover the step.

According to one embodiment, the reliability of the semiconductor device can be improved, and the decrease in the manufacturing yield can be suppressed.

BRIEF DESCRIPTION OF THE DRAWINGS

FIG. 7 is a cross-sectional view showing the method of manufacturing the semiconductor device following FIG. 6.

DETAILED DESCRIPTION

Figure 1:
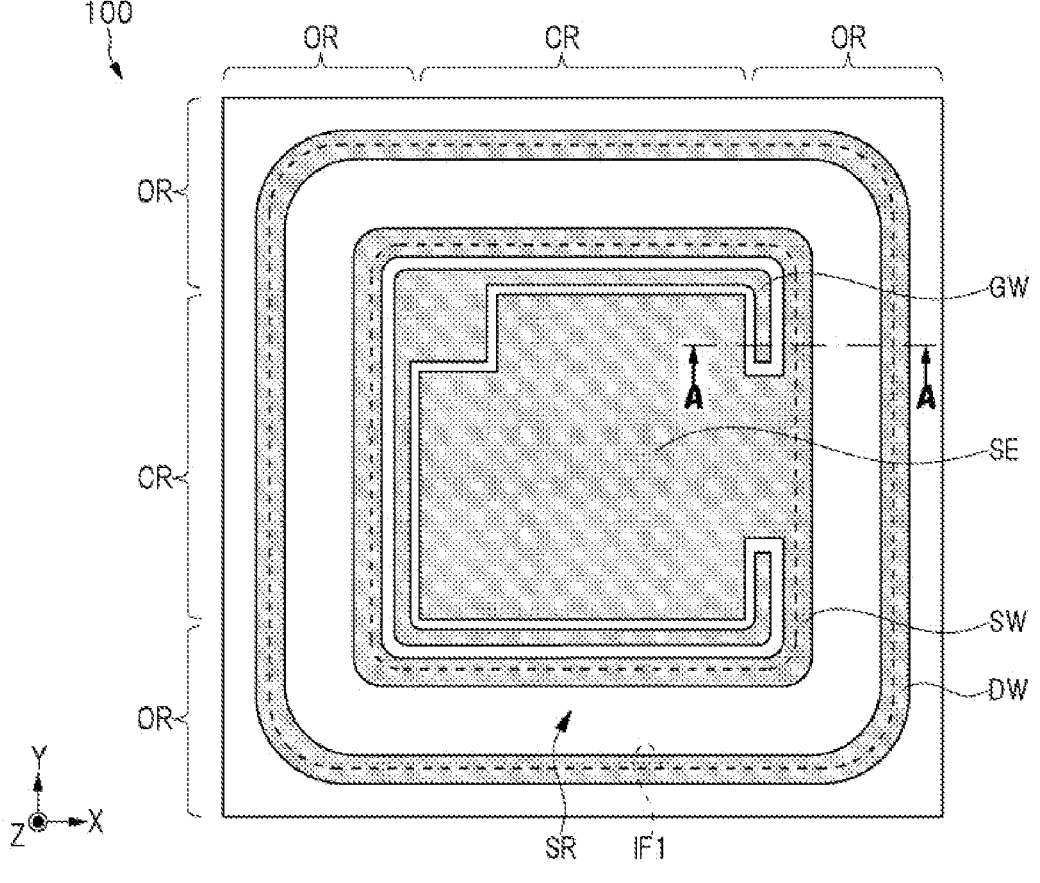
FIG. 1 is a plan view showing a semiconductor device according to a first embodiment.

An embodiment will be described below in detail on the basis of drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in the present application intersect each other and are orthogonal to each other. In the present application, the Z direction is explained as a vertical direction, a height direction or a thickness direction of one certain structure. In addition, the expressions such as "plan view" and "planar view" used in the present application means that the plane formed by the X direction and the Y direction is a "plane" and the "plane" is viewed from the Z direction.

FIRST EMBODIMENT

<Structure of Semiconductor Device>

Figure 2:
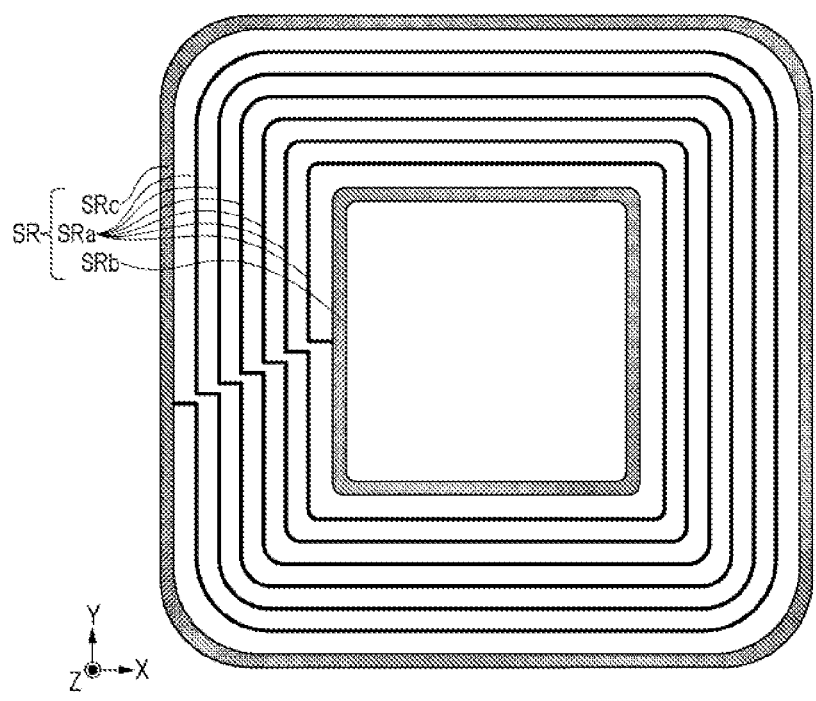
FIG. 2 is a plan view showing an outline of a resistive element according to the first embodiment.
Figure 3:
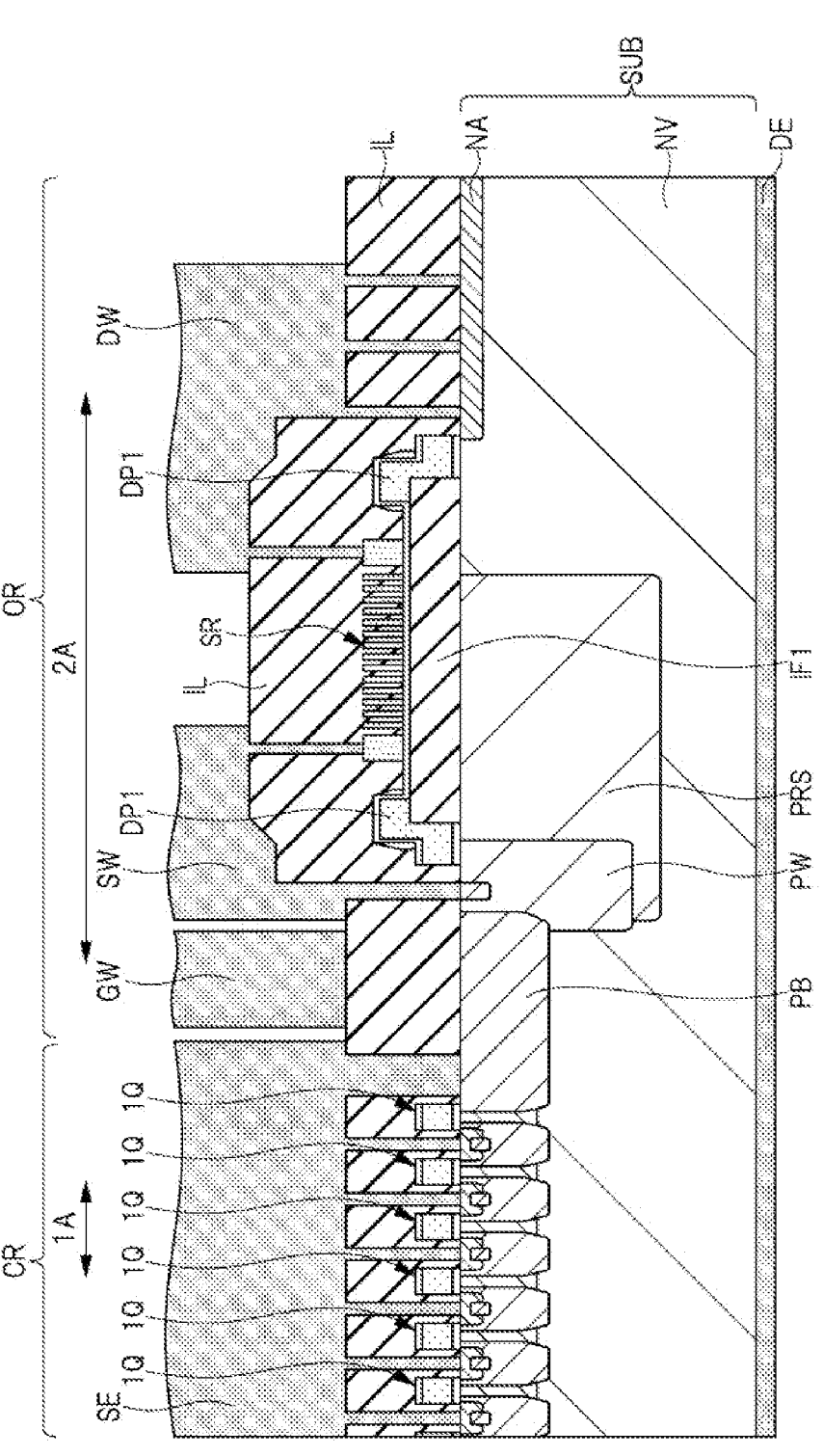
FIG. 3 is a cross-sectional view showing the semiconductor device according to the first embodiment.
Figure 4:
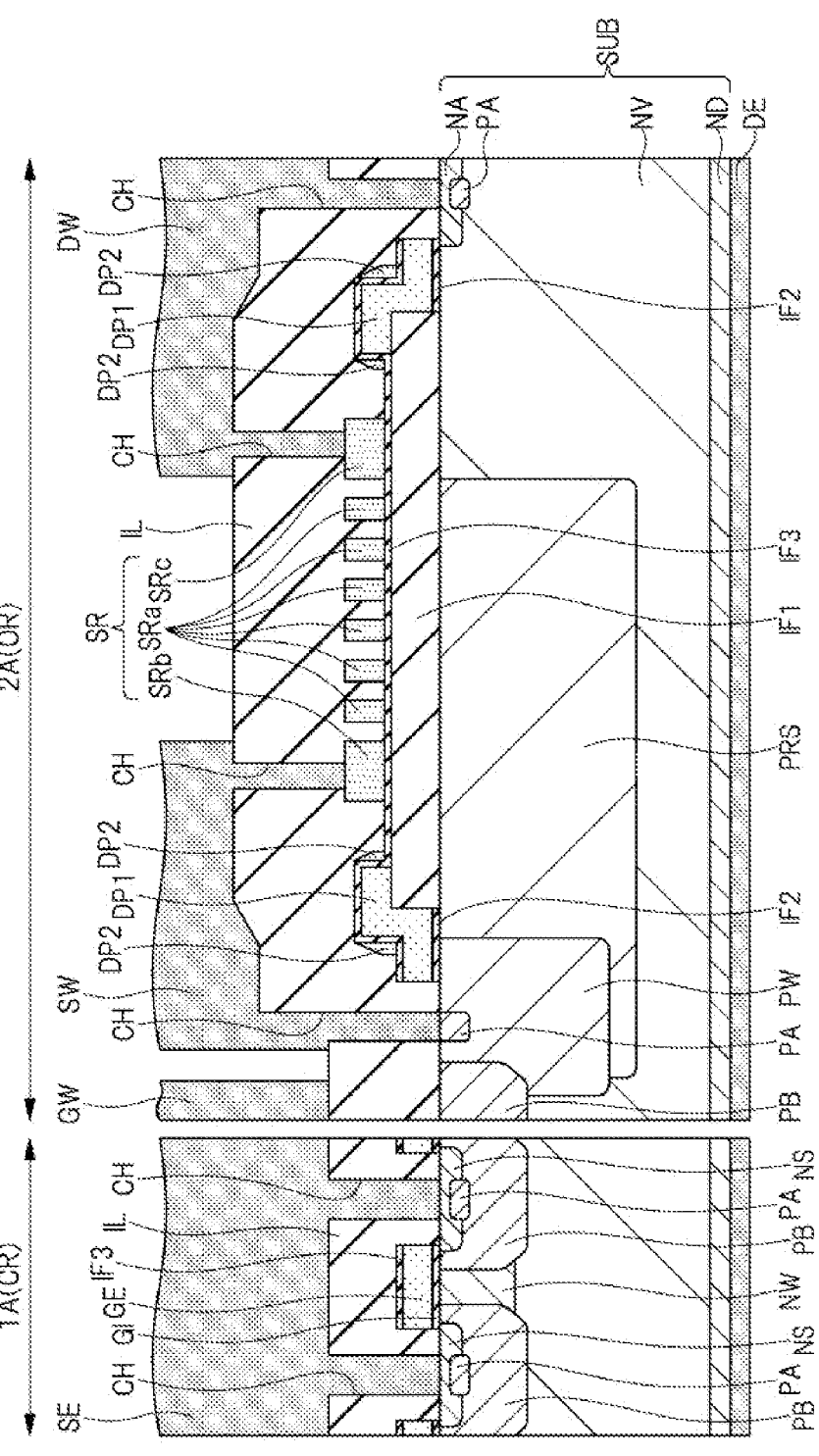
FIG. 4 is a cross-sectional view showing the semiconductor device according to the first embodiment.

A semiconductor device 100 according to the first embodiment will be described below with reference to FIGS. 1 to 4. FIG. 1 is a plan view of a semiconductor chip, namely, a semiconductor device 100. FIG. 2 is a plan view showing an outline of a resistive element SR. FIG. 3 is a cross-sectional view along line A-A shown in FIG. 1. FIG. 4 is a cross-sectional view showing a region 1A in which a part of a cell region CR is enlarged and a region 2A in which a part of an outer peripheral region OR is enlarged.

FIG. 1 shows a line pattern formed mainly above a semiconductor substrate SUB. Semiconductor device 100 has a cell region CR in which a MOSFET is formed, and an outer peripheral region OR surrounding the cell region CR in a plan view.

As shown in FIG. 1, the cell region CR is covered with a source electrode SE. In a plan view, the gate wiring GW surrounds the source electrode SE, the source wiring SW surrounds the gate wiring DW, and the drain line OOE surrounds the source wiring SW. The source line SW is electrically connected to the source SE. Here, the gate wiring GW does not completely surround the source electrode SE, and the source electrode SE and the source wiring SW are integrally connected to each other at a portion where a portion of the gate wiring GW is divided.

Although not illustrated here, the source electrode SE, the gate wiring GW, the source wiring SW, and the drain wiring DW are covered with a protective film such as a polyimide film. An opening is provided in a part of the protective film, and the source electrode SE and the gate wiring GW exposed in the opening become the source pad and the gate pad. An external connecting member such as a wire or a clip (copper plate) is connected to the source pad and the gate pad, so that semiconductor device 100 is electrically connected to another semiconductor chip, a wire substrate, or the like.

An insulating film IF1 and the resistive element SR are formed between the source wiring SW and the drain-line DW so as to surround the cell region CR in a plan view. The resistive element SR is formed on the insulating film IF1.

As shown in FIG. 2, the resistive element SR includes a resistance portion SRa formed in a spiral shape, a first contact portion SRb located at the inner side of the resistance portion SRa, and a second contact portion SRc located at the outer side of the resistance portion SRa. The resistance portion SRa, the first contact portion SRb, and the second contact portion SRc are integrated with each other and also formed of the same conductive film as each other. The resistance portion SRa is made of one conductive film that is passing around the cell region CR with plural times. Note that the number of rounds of the resistance portion SRa is not limited to the example shown in FIG. 2, and can be appropriately set. In addition, the first contact portion SRb and the second contact portion SRc are formed in a loop shape. As will be described later, the first contact portion SRb is electrically connected via the hole CH to the source wiring SW, and the second contact portion SRc is electrically connected via the hole CH to the drain wiring DW. One end of the resistance portion SRa is connected to the first contact portion SRb, and the other end of the resistance portion SRa is connected to the second contact portion SRc. Therefore, a current flows through the resistive element SR.

In the equivalent circuit, the resistive element SR is connected between source of a MOSFET 1Q and drain of the MOSFET 1Q. Since the voltage between the source and the drain is divided as the length of the resistance portion SRa is long and the number of times of the circumference of the resistance portion SRa is large, the electric field is relaxed from the drain line DW toward the source wiring SW. Therefore, the withstand voltage of semiconductor device 100 can be improved in the outer peripheral region OR.

As shown in FIGS. 3 and 4, a plurality of the MOSFETs 1Q is formed in the cell region CR, and the resistive element SR is formed in the outer peripheral region OR. First, the structure of the MOSFET 1Q of the cell region CR (region LA) will be described, followed by the structure of the resistive element SR of the outer peripheral region OR (region 2A) and the structure around it.

The semiconductor device 100 comprises an n-type semiconductor substrate SUB having an upper surface and a bottom surface. Semiconductor substrate SUB has a low-concentration n-type drift-region NV. Here, the n-type semiconductor substrate SUB itself constitute the drift-region NV. Note that the drift-region NV may be an n-type semiconducting layer grown on an n-type silicon substrate while introducing phosphorus (P) by an epitaxial growth method.

In the present application, a stack of such n-type silicon substrate and n-type semiconductor layers is also described as being semiconductor substrate SUB.

A gate insulating film GI is formed on upper surface of semiconductor substrate SUB of the cell region CR. A gate electrode GE is formed on the gate insulating film GI. An insulating film IF3 is formed on the gate electrode GE. The gate insulating film GI is, for example, a silicon oxide film, and has a thickness of, for example, 80 nm or more and 12 0 nm or less. The gate electrode GE is, for example, an n-type doped polycrystalline silicon film, and has a thickness of, for example, 400 nm or more and 500 nm or less. The insulating film IF3 is, for example, a silicon oxide film, and has a thickness of, for example, 80 nm or more and 120 nm or less.

In semiconductor substrate SUB of upper surface of semiconductor substrate SUB, a p-type body region CR is formed. In the body region PB, an n-type source region NS is formed. The source region NS has a higher impurity concentration than the drift region NV. Further, a p-type high-concentration diffused region PA is formed in the body region PB. The high-concentration diffused region PA has a higher impurity concentration than the body region PB.

The gate electrode GE is formed so as to straddle the two body regions PB via the gate insulating film GI. An n-type well region NW is formed in semiconductor substrate SUB between the two body regions PB. The well region NW has a higher impurity concentration than the drift region NV. A body region PB located between the source region NS and the well region NW and located below the gate electrode GE functions as a channel region of the MOSFET 1Q.

On the lower surface of semiconductor substrate SUB, an n-type drain-region ND is formed in semiconductor substrate SUB. The drain region ND has a higher impurity concentration than the drift region NV. A drain electrode DE is formed under the lower surface of semiconductor substrate SUB. A drain voltage is supplied to semiconductor substrate SUB (drain region ND, drift region NV) from the drain electrode DE. The drain electrode DE consist of a single layer of metallic membranes, such as aluminum membranes, titanium membranes, nickel membranes, gold membranes or silver membranes, or laminated membranes with these metallic membranes laminated accordingly.

A path from the source region NS to the drain region ND via the channel region (body region PB), the well region NW, and the drift region NV serves as a current path of the MOSFET 1Q.

An interlayer insulating film IL is formed on the upper surface of the semiconductor substrate SUB so as to cover the MOSFET 1Q in the cell region CR. The interlayer insulating film IL is formed of, for example, a stacked film of a silicon nitride film and a silicon oxide film formed on the silicon nitride film. The silicon oxide film may include a thick silicon oxide film (PSG: Phospho Silicate Glass film) containing phosphorus and a thick silicon oxide film (BPSG: Boro Phospho Silicate Glass film) containing boron and phosphorus. The thickness of the interlayer insulating film IL is, for example, 900 nm or more and 1200 nm or less.

A hole CH reaching the source region NS is formed in the interlayer insulating film IL. Although not illustrated here, in the depth direction (Y direction) of the drawing, the source region NS is divided, and the high-concentration diffused region PA is formed on the surface of the body region PB. The hole CH extends in the Y direction. That is, a part of the hole CH reaches the high-concentration diffused region PA.

In the cell region CR, the source electrode SE is formed on the interlayer insulating film IL. The source electrode SE is embedded in the hole CH. The source electrode SE is electrically connected to the source region NS, the highly diffused region PA, and the body region PB.

Although not illustrated here, a hole reaching the gate electrode GE is also formed in the interlayer insulating film IL. The gate wiring GW is formed on the interlayer insulating film IL and embedded in the hole CH. Therefore, the gate wiring GW is electrically connected to the gate electrode GE and supplies a gate voltage to the gate electrode GE.

Next, the structure of the resistive element SR in the outer peripheral region OR (region 2A) and the structure around the resistive element will be described.

An insulating film IF1 is formed on upper surface of semiconductor substrate SUB in the outer peripheral region OR. The insulating film IF1 is, for example, a silicon oxide film, and has a thickness of, for example, 900 nm or more and 1200 nm or less.

The resistive element SR is formed on the insulating film IF1 via the insulating film IF3. As described above, the resistive element SR includes the resistance portion SRa, the first contact portion SRb, and the second contact portion SRc. The resistive element SR is, for example, a p-type doped polycrystalline silicon film, and has a thickness of, for example, 500 nm or more and 700 nm or less.

An insulating film IF2 is formed on the upper surface of the semiconductor substrate SUB in the outer peripheral region OR. The insulating film IF2 is made of the same insulating film as the gate insulating film GI, has a thickness smaller than that of the insulating film IF1, and has a thickness of, for example, 80 nm or more and 120 nm or less.

A step is occurred between the insulating film IF2 and the insulating film IF1. A dummy pattern DP1 is formed from a portion over the insulating film IF2 to a portion over the insulating film IF1 so as to cover the step. The dummy pattern DP1 is made of a conductive film which is the same as the gate electrode GE, and which is different from the resistive element SR.

A dummy pattern DP2 is formed on a side surface of the dummy pattern DP1 formed at a position higher than the insulating film IF1 via the insulating film IF3. The dummy pattern DP2 is formed of the same conductive film as that of the resistive element SR.

The dummy pattern DP1 and the dummy pattern DP2 are in a floating state, and are not electrically connected to a semiconductive element such as the MOSFET 1Q and the resistive element SR.

In the semiconductor substrate SUB of upper surface of semiconductor substrate SUB, a p-type RESURF (Reduced Surface Field) region OR is formed. The RESURF region PRS is formed directly below the resistive elements SR via the insulating film IF1. A p-type well region PW is formed in the RESURF region PRS. A high-concentration diffused region PA is formed in the well region PW. The well region PW is electrically connected to the body region PB of the cell region CR. The well region PW has a higher impurity concentration than the RESURF region PRS, and has a lower impurity concentration than the high-concentration diffused region PA.

In the semiconductor substrate SUB of upper surface of OR, an n-type highly diffused region NA is formed. The high-concentration diffused region NA has a higher impurity concentration than the drift region NV. In addition, a high-concentration diffusion region PA is formed in the high-concentration diffusion diffusion region NA.

An interlayer insulating film IL is formed on upper surface of semiconductor substrate SUB so as to cover the resistive element SR, the dummy pattern DP1, and the insulating film IF1 in the outer peripheral region OR. In the interlayer insulating film IL, a plurality of holes CH that reach the first contact portion SRb, the second contact portion SRc, the high-concentration diffusion region NA, and the high-concentration diffusion region PA are formed. Note that, as shown in FIG. 2, the first contact portion SRb and the second contact portion SRc have an annular shape in plan view, but the hole CH reaching these portions also have an annular shape in plan view along the shapes of the first contact portion SRb and the second contact portion SRc.

In the outer peripheral region OR, the source wiring SW and the drain-line DW are formed on the interlayer insulating film IL. The source wiring SW and the drain wiring DW are embedded in the plurality of holes CH, respectively.

The source wiring SW is electrically connected to the high-concentration diffused region PA, the well region PW, the RESURF region PRS, and the body region PB. The source wiring SW is connected to the first contact portion SRb and supplies a source voltage to the first contact portion SRb.

The drain line DW is electrically connected to the drain electrode DE via an n-type semiconductor substrate SUB (high-concentration diffusion region NA, drift region NV, and drain region ND). The drain-line DW is connected to the second contact portion SRc. Therefore, the drain voltage supplied from the drain electrode DE to the drain line DW is also supplied to the second contact portion SRc.

The source electrode SE, the gate wiring GW, the source wiring SW, and the drain wiring DW include, for example, a barrier metal film and a conductive film formed on the barrier metal film. The barrier metal film is, for example, a titanium tungsten film or a titanium nitride film, and the conductive film is, for example, an aluminum film.

Note that the source electrode SE, the gate wiring GW, the source wiring SW, and the drain wiring DW may include a plug layer filling the inside of the hole CH and a wiring layer formed on the interlayer insulating film IL. In this case, the wiring layer includes the barrier metal film and the conductive film. The plug layer is formed of, for example, a stacked film of a barrier metal film such as a titanium nitride film and a conductive film such as a tungsten film.

<Method of Manufacturing Semiconductor Device>

Each manufacturing process included in the method of manufacturing the semiconductor device 100 will be described below with reference to FIGS. 5 to 16. In the following explanation, the region LA (cell region CR) and the region 2A (outer peripheral region OR) of FIG. 4 are used.

The main features of semiconductor device 100 and its manufacturing method in the first embodiment are the resistive element SR, the dummy pattern DP1, and manufacturing method of the dummy pattern DP2, and these features will be described in more detail later in comparison with the examined example.

Figure 5:
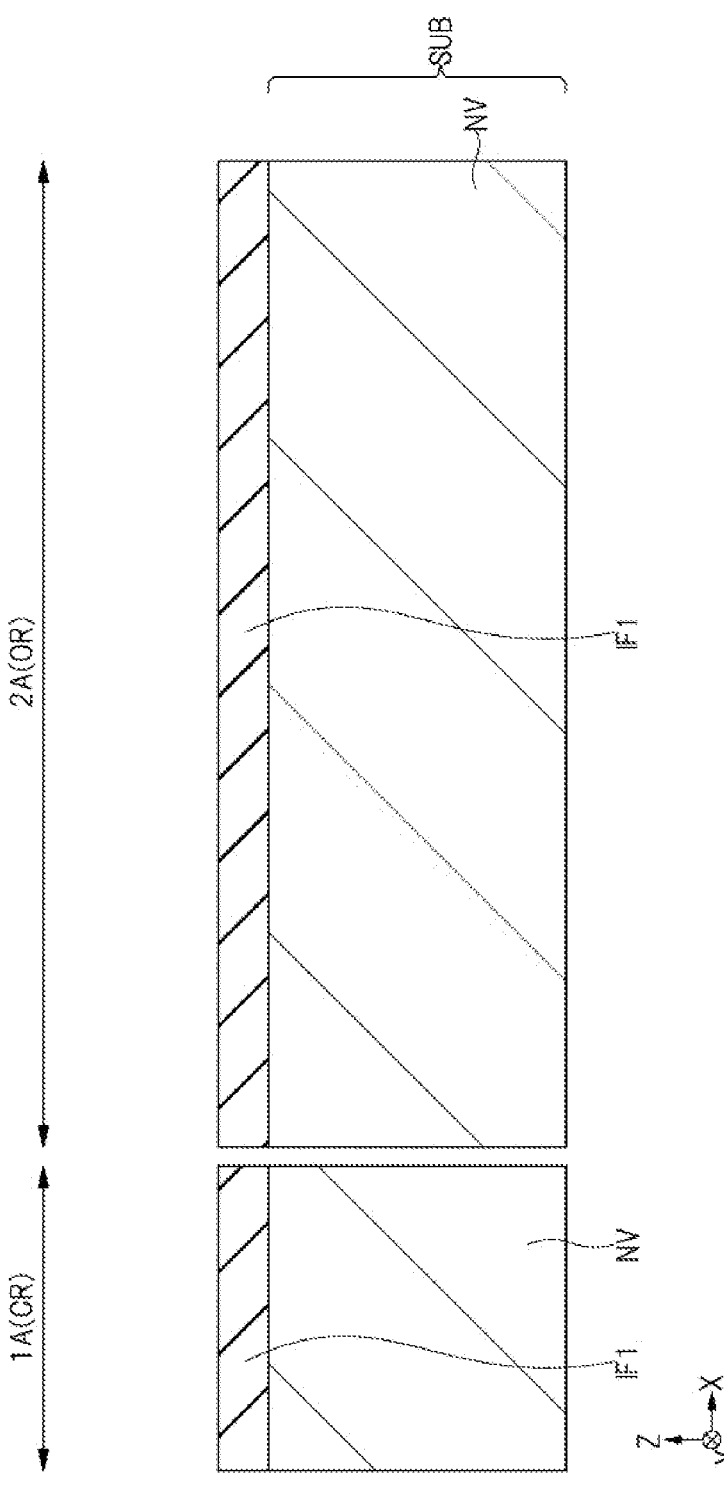
FIG. 5 is a cross-sectional view showing a method of manufacturing the semiconductor device according to the first embodiment.

As shown in FIG. 5, first, an n-type semiconductor substrate SUB having an upper surface and a lower surface is prepared. As described above, the n-type semiconductor substrate SUB itself constitute the drift region NV, but the drift region NV may be an n-type semiconducting layer grown on the n-type silicon substrate while introducing phosphorus (P) by epitaxial growth. Next, an insulating film IF1 is formed on upper surface of semiconductor substrate SUB by thermal oxidization.

Figure 6:
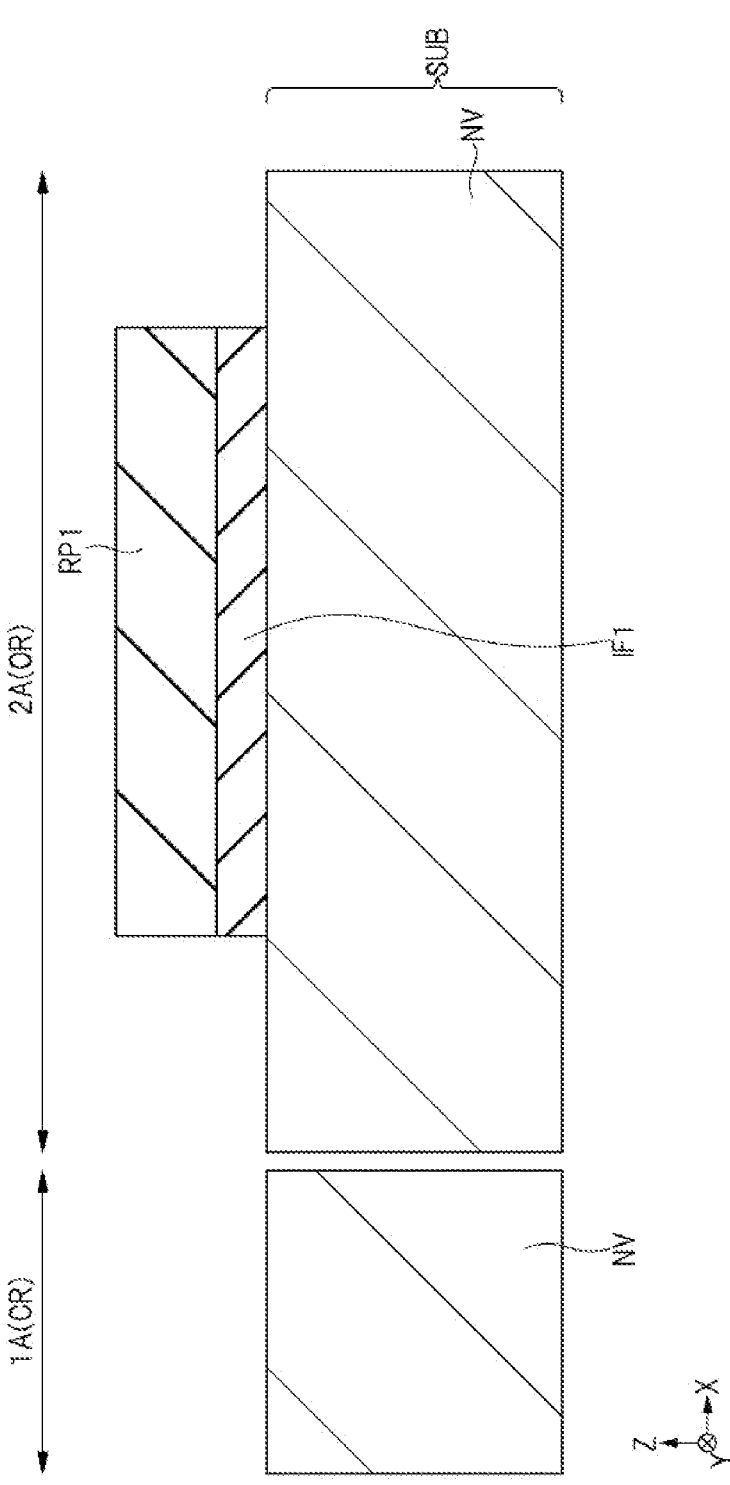
FIG. 6 is a cross-sectional view showing the method of manufacturing the semiconductor device following FIG. 5.

As shown in FIG. 6, first, a resist pattern RP1 having a pattern covering a part of the outer peripheral region OR is formed on the insulating film IF1. Next, an anisotropic etching process is performed using the resist pattern RP1 as a mask to pattern the insulating film IF1. Accordingly, the insulating film IF1 is formed on upper surface of semiconductor substrate SUB of the outer peripheral region OR so as to surround the cell region CR in a plan view. Thereafter, the resist pattern RP1 is removed by an asking treatment.

Figure 7:
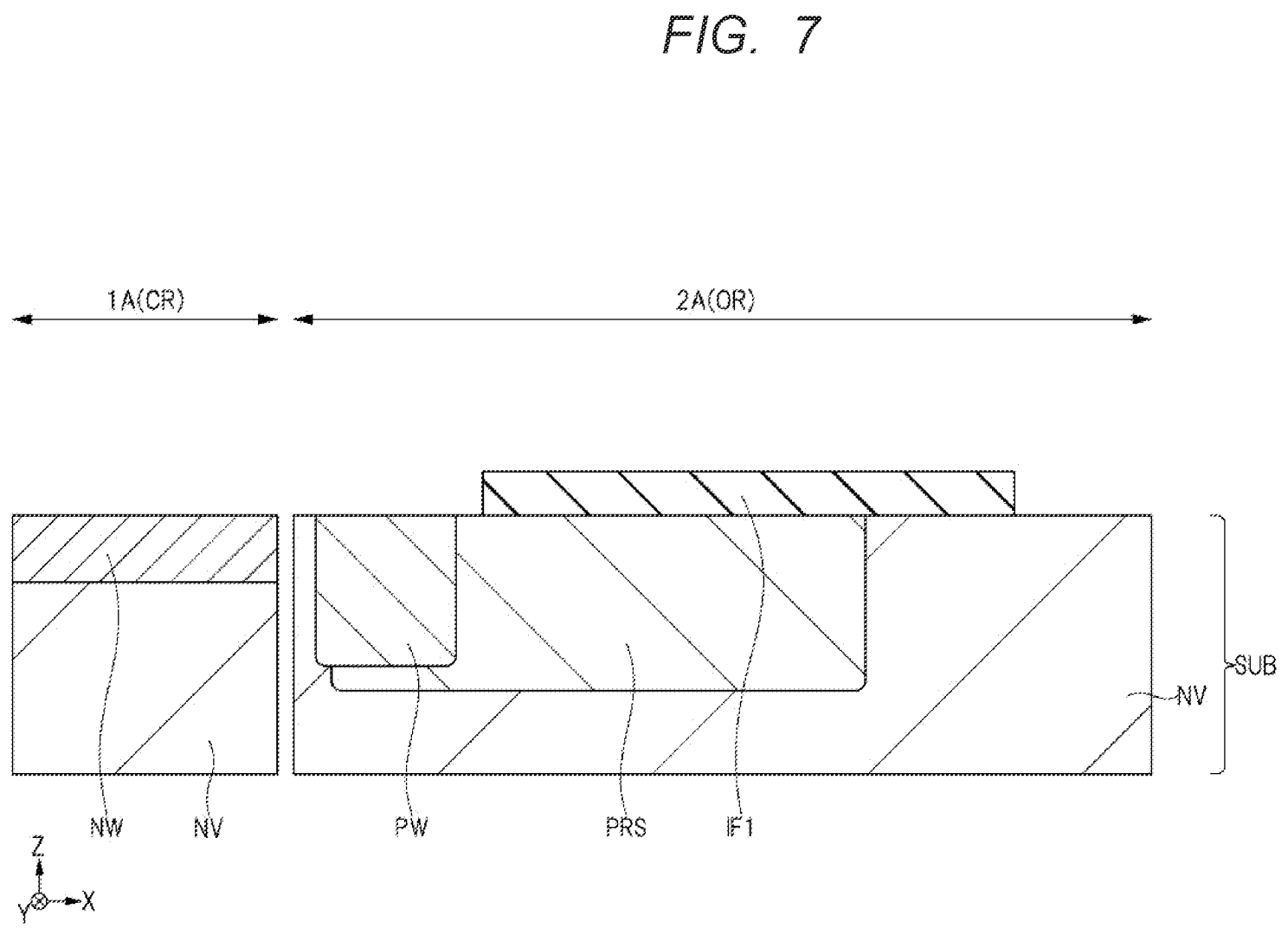

As shown in FIG. 7, an n-type well region NW is formed on semiconductor substrate SUB of the cell region CR by photolithography and ion-implantation, and a p-type RESURF region PRS and a p-type well region PW are formed on semiconductor substrate SUB of the outer peripheral region OR. Thereafter, for example, the impurities contained in the well region NW, the RESURF region PRS and the well region PW are diffused by performing a heat treatment at 1200 degrees Celsius.

Figure 8:
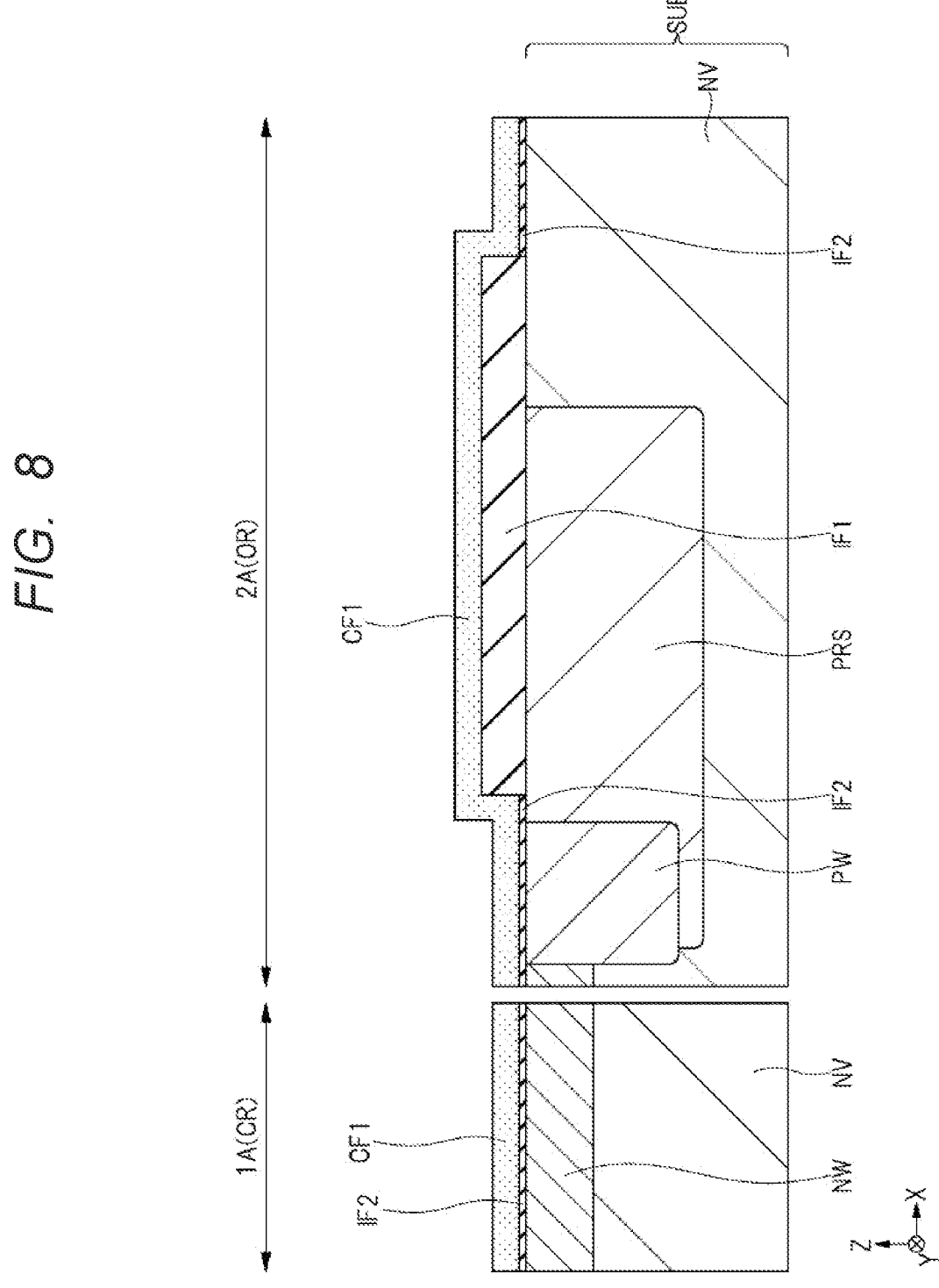
FIG. 8 is a cross-sectional view showing the method of manufacturing the semiconductor device following FIG. 7.

As shown in FIG. 8, first, an insulating film IF2 having a thickness thinner than that of the insulating film IF1 is formed on upper surface of semiconductor substrate SUB of the cell region CR and the outer peripheral region OR by the thermal oxidation method. Next, a conductive film CF1 is formed on the insulating film IF1 and the insulating film IF2 by, e.g., CVD. The conductive film CF1 is a polycrystalline silicon film into which an n-type impurity is introduced, and is formed so as to cover a step occurring between the insulating film IF2 and the insulating film IF1.

Figure 9:
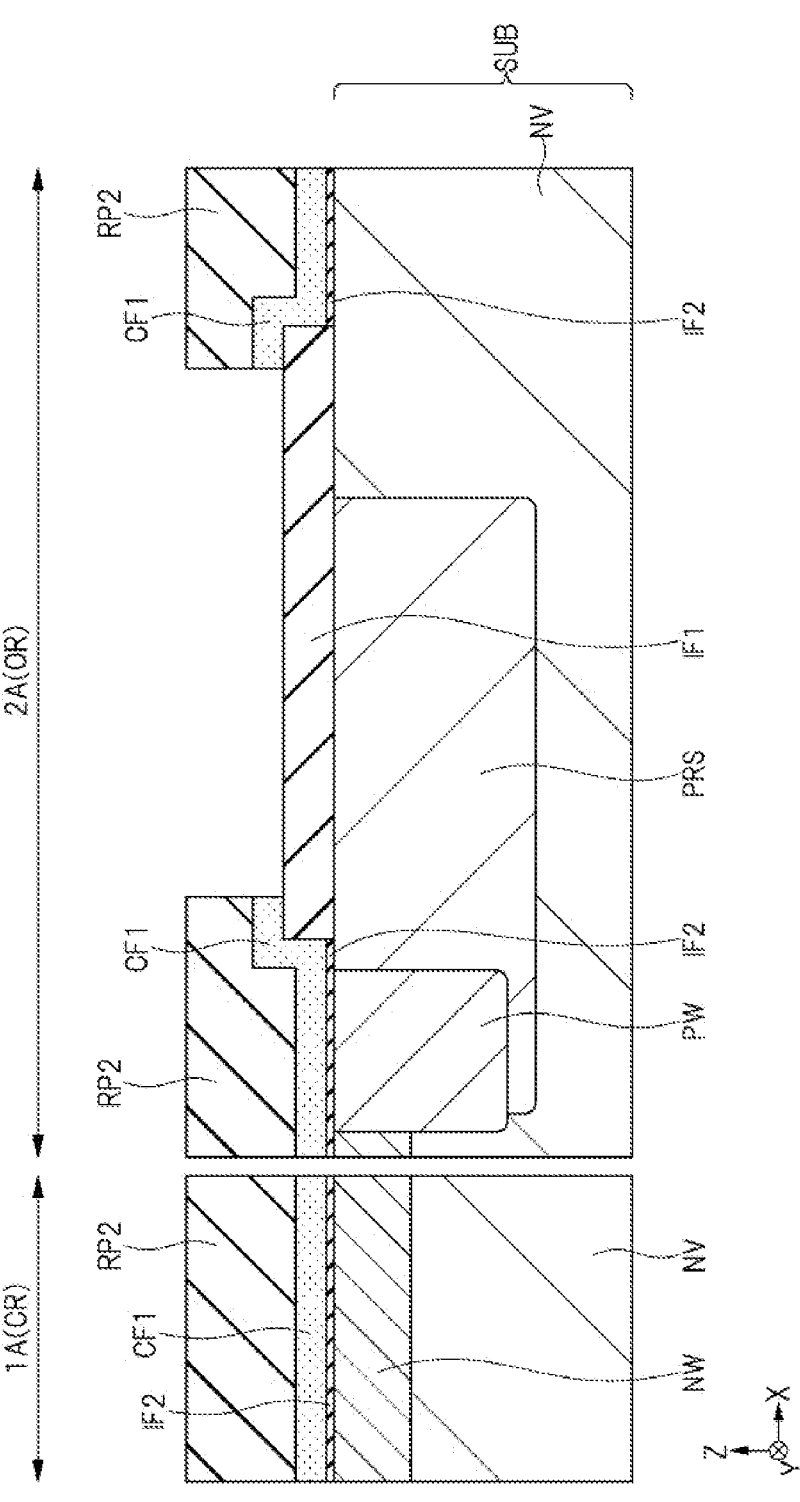
FIG. 9 is a cross-sectional view showing the method of manufacturing the semiconductor device following FIG. 8.

As shown in FIG. 9, a resist pattern RP2 having a pattern opening in the vicinity of the center of the insulating film IF1 is formed on the conductive film CF1. Next, the conductive film CF1 is patterned by performing an anisotropic etching process using the resist pattern RP2 as a mask. By this patterning, a portion of the conductive film CF1 on the insulating film IF1 is selectively removed so that the conductive film CF1 covering the step is left. Note that the conductive film CF1 of the cell region CR is also left. Thereafter, the resist pattern RP2 is removed by an asking treatment.

Figure 10:
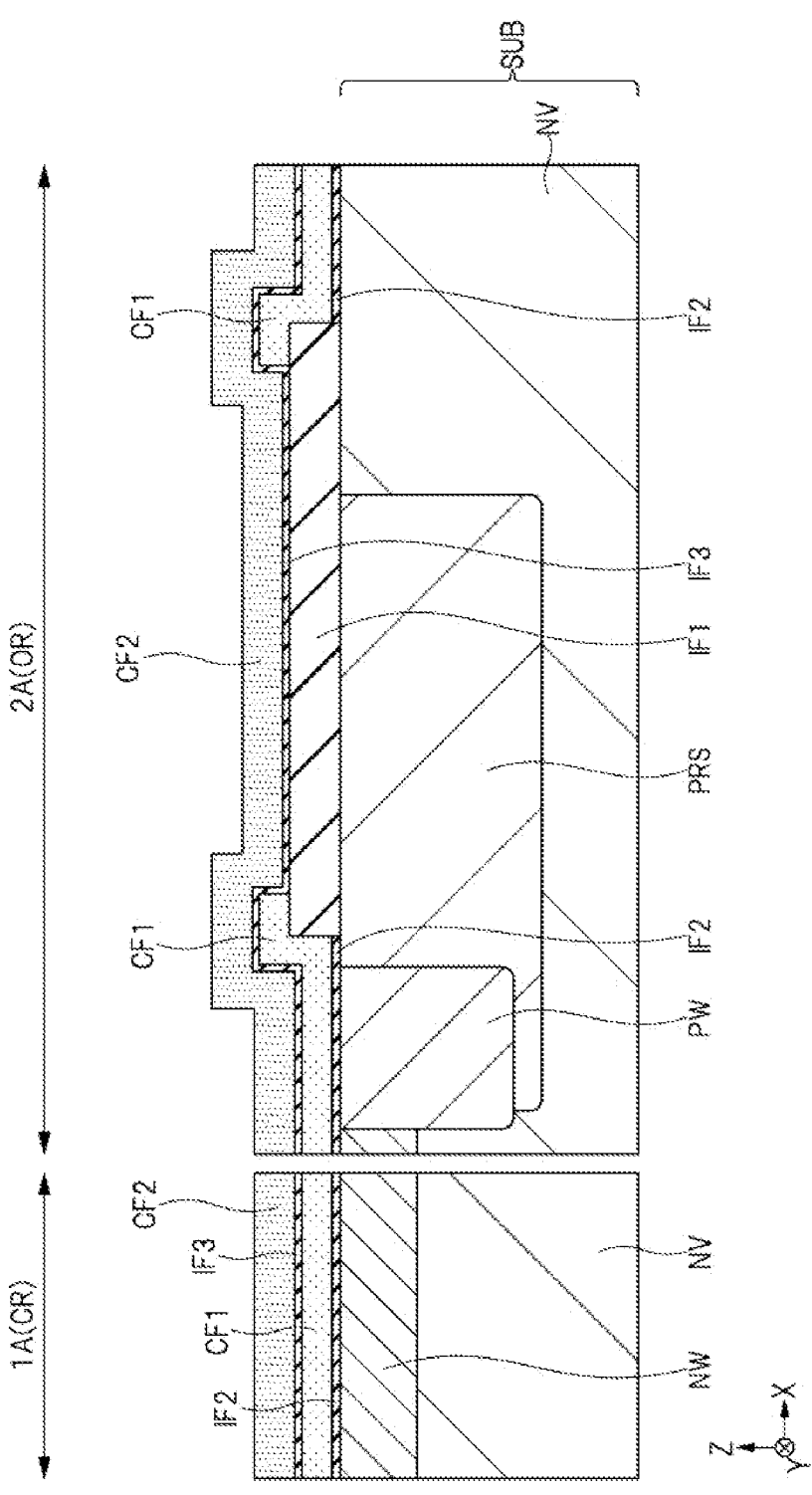
FIG. 10 is a cross-sectional view showing the method of manufacturing the semiconductor device following FIG. 9.

As shown in FIG. 10, first, an insulating film IF3 is formed on the insulating film IF1 and the conductive film CF1 by, for example, a CVD method. Next, a conductive film CF2 is formed on the insulating film IF3 by, e.g., CVD. The conductive film CF2 is a non-doped polysilicon film. Next, a p-type impurity such as boron (B) or boron difluoride (BF2) is introduced into the conductive film CF2 by ion-implantation.

Figure 11:
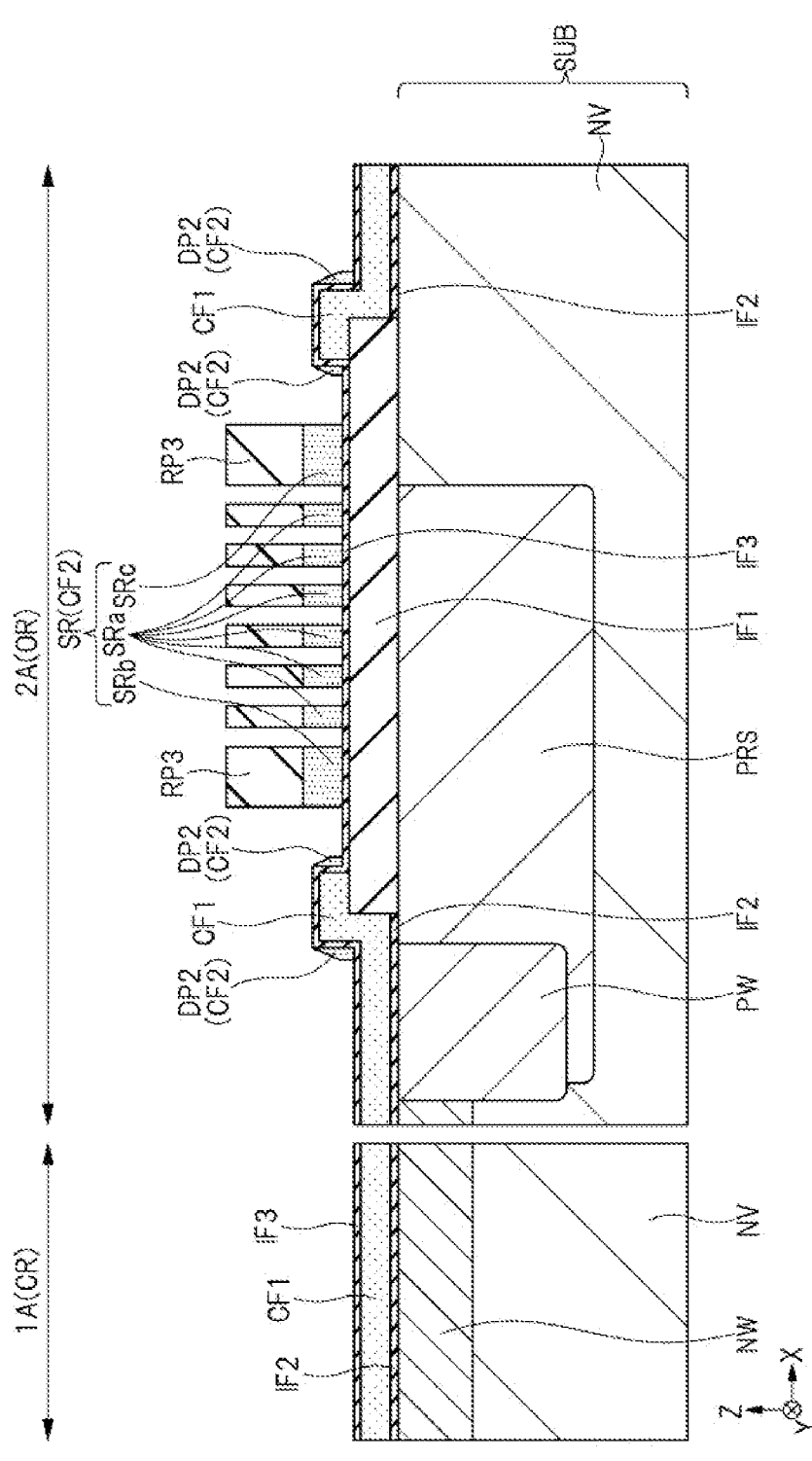
FIG. 11 is a cross-sectional view showing the method of manufacturing the semiconductor device following FIG. 10.

As shown in FIG. 11, first, on the conductive film CF2, a resist pattern RP3 that selectively covers the conductive film CF2 located on the insulating film IF1 is formed. Next, the conductive film CF2 is subjected to an anisotropic etching process using the resist pattern RP3 as a mask. As described above, by patterning the conductive film CF2, the resistive element SR located on the insulating film IF1 are formed so as to surround the cell regions CR in a plan view. Thereafter, the resist pattern RP3 is removed by an ashing treatment.

In addition, by the anisotropic etching process, the conductive film CF2 is left as a dummy pattern DP2 on the side surface of the conductive film CF1 formed at a position higher than the insulating film IF1 via the insulating film IF3. Note that the conductive film CF2 in the cell region CR is completely removed.

Figure 12:
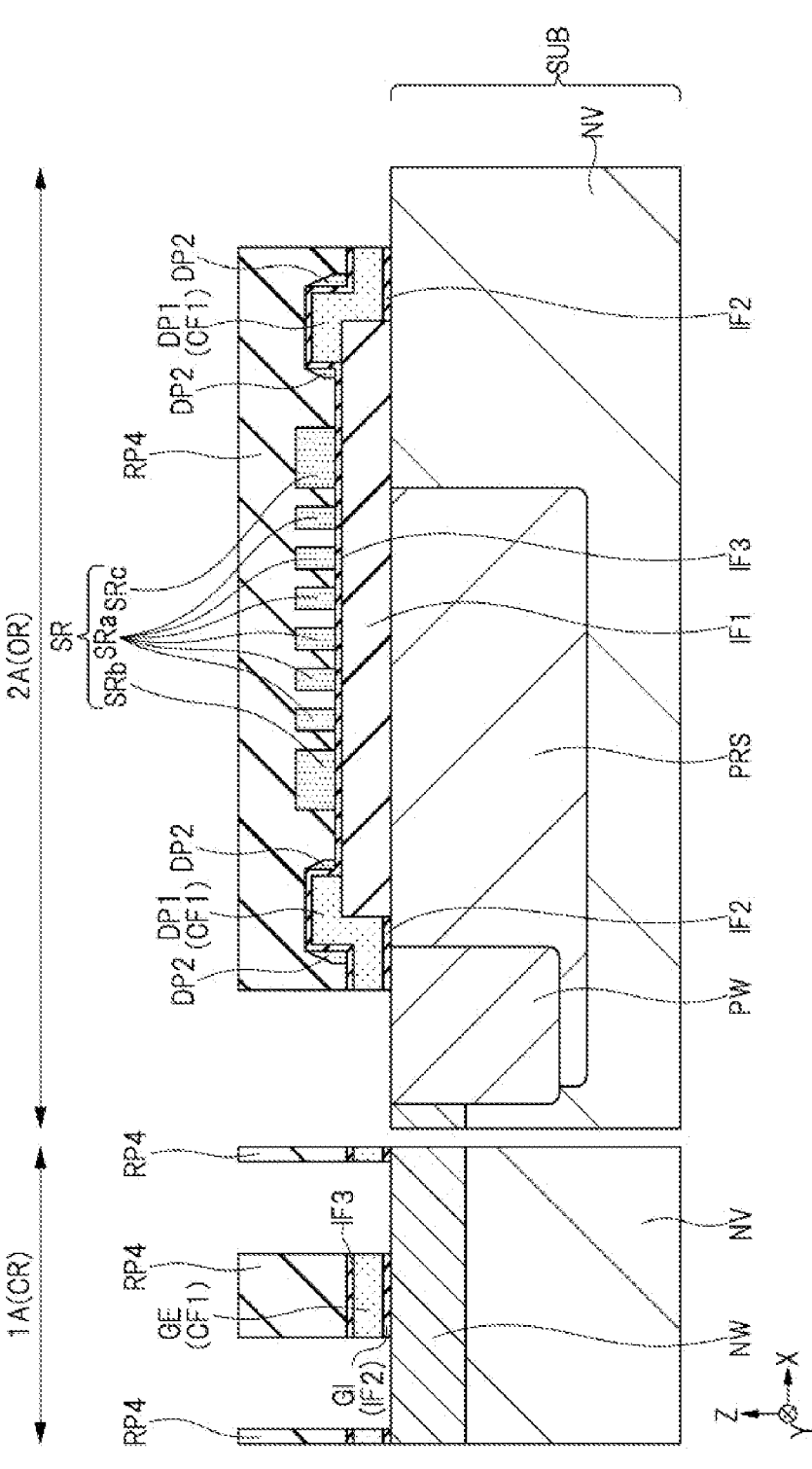
FIG. 12 is a cross-sectional view showing the method of manufacturing the semiconductor device following FIG. 11.

As shown in FIG. 12, first, in the outer peripheral region OR, the resistive elements SR and the conductive film CF1 in the vicinity of the step are covered, and a resist pattern RP4 selectively covering the conductive film CF1 in the cell region CR is formed. Next, an anisotropic etching process is performed on the conductive film CF2 using the resist pattern RP4 as a mask, whereby a part of the insulating film IF3 on upper surface of semiconductor substrate SUB, a part of the conductive film CF1, and a part of the insulating film IF2 are selectively removed. Thereafter, the resist pattern RP4 is removed by an ashing treatment.

Here, the conductive film CF1 left in the outer peripheral region OR composes a dummy pattern DP1. The dummy pattern DP1 is formed from a portion over the insulating film IF2 to a portion over the insulating film IF1 so as to cover the step occurring between the insulating film IF2 and the insulating film IF1. In addition, the conductive film CR left in the cell region CF1 composes the gate electrode GE of the MOSFET 1Q, and the insulating film IF2 left in the cell region CF1 composes the gate insulating film GI of the MOSFET 1Q.

Figure 13:
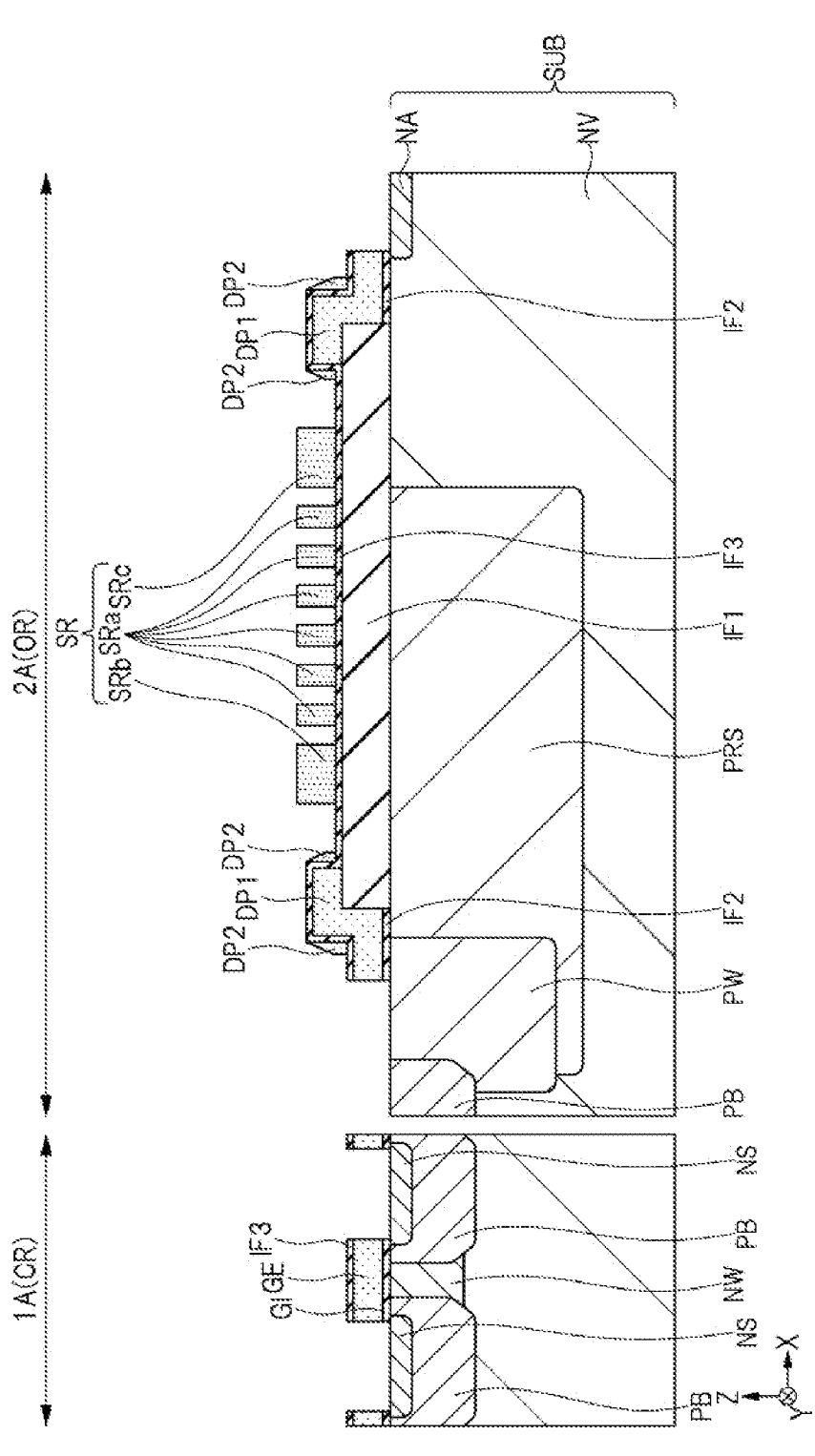
FIG. 13 is a cross-sectional view showing the method of manufacturing the semiconductor device following FIG. 12.

As shown in FIG. 13, first, a p-type body region semiconductor substrate SUB upper surface of semiconductor substrate SUB is formed with a p-type body region CR by a photolithography technique and an ion-implantation method. Thereafter, for example, the impurities contained in the body region PB are diffused by performing a heat treatment at 1100 degrees Celsius.

Next, an n-type source region NS is formed in the body region PB by photolithography and ion implantation, and an n-type highly diffused region NA is formed in semiconductor substrate SUB of the outer peripheral region OR. Thereafter, for example, the impurities contained in the source region NS and the high-concentration diffusion region NA are diffused by performing a heat treatment at 950 degrees Celsius.

Although not illustrated here, a through film such as a silicon oxide film is formed on semiconductor substrate SUB prior to the ion-implantation. The through film may be removed after ion-implantation, but may be left as a part of an interlayer insulating film IL described later.

Figure 14:
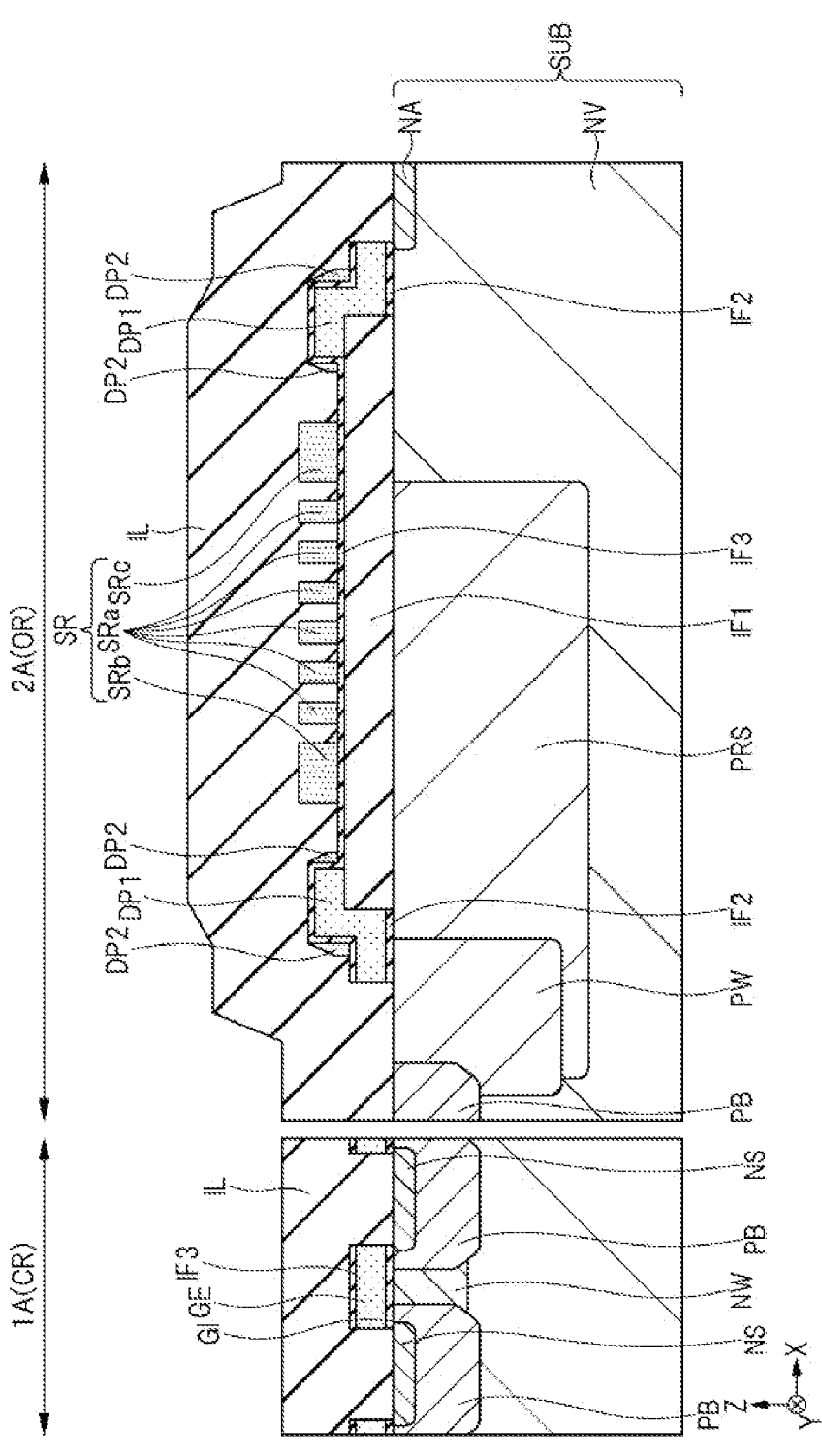
FIG. 14 is a cross-sectional view showing the method of manufacturing the semiconductor device following FIG. 13.

As shown in FIG. 14, an interlayer insulating film CR is formed over the MOSFET 1Q in the cell region IL and covers the resistive element SR, the dummy pattern DP1, the dummy pattern DP2, and the insulating film IF1 in the outer peripheral region OR on upper surface of semiconductor substrate SUB. The interlayer insulating film IL is, for example, a laminated film including a silicon nitride film formed by a CVD method, a silicon oxide film formed by a CVD method, a PSG film formed by a coating method, and a BPSG film formed by a coating method.

Figure 15:
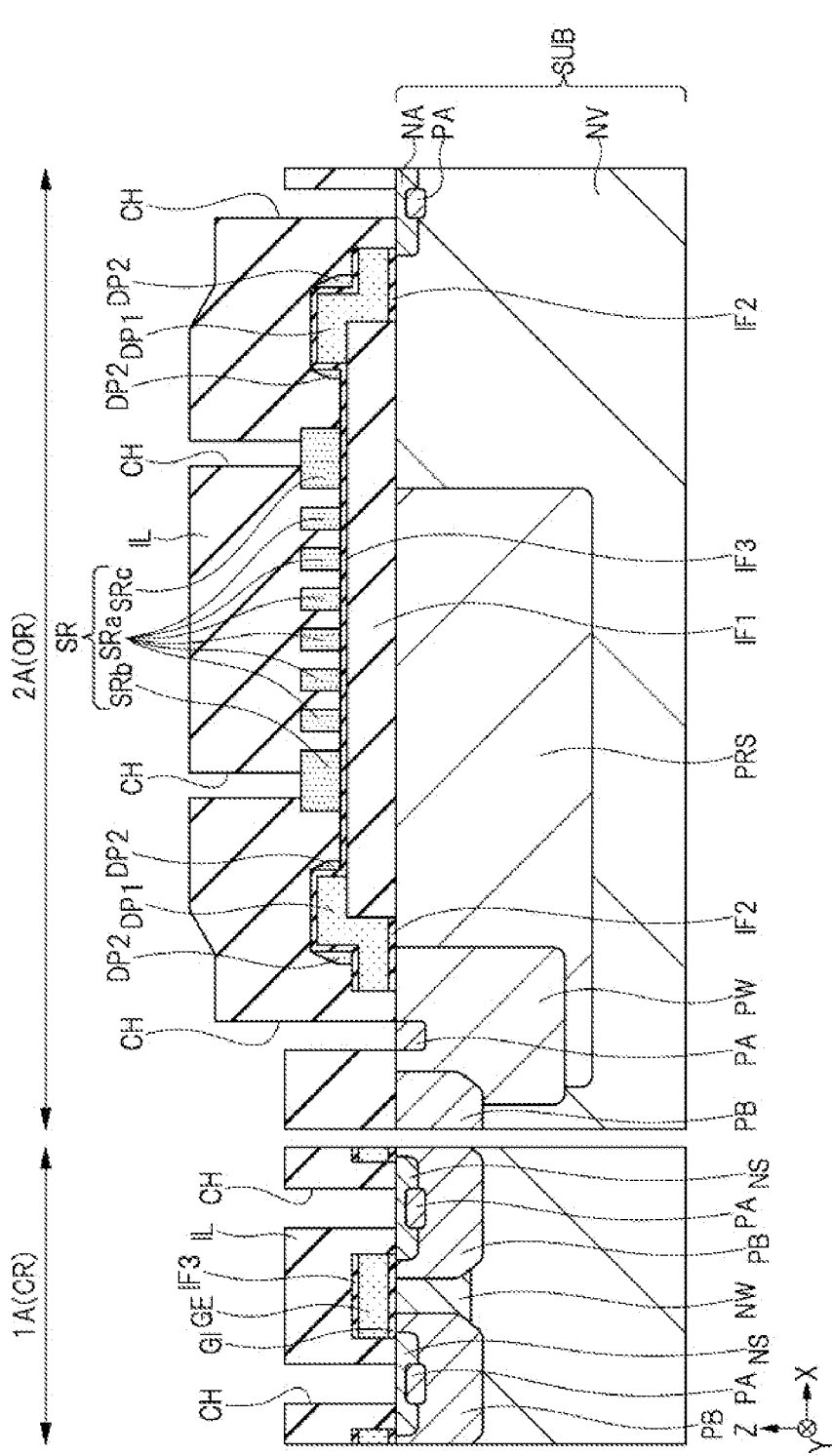
FIG. 15 is a cross-sectional view showing the method of manufacturing the semiconductor device following FIG. 14.

As shown in FIG. 15, first, a plurality of holes CH are formed in the interlayer insulating film IL by a photolithography technique and an anisotropic etching process. The plurality of holes CH includes a hole reaching the first contact portion SRb, a hole reaching the second contact portion SRc, a hole reaching semiconductor substrate SUB (high-concentration diffusion region NA, well region PW) of the outer peripheral region OR, a hole reaching the source region NS, and a hole reaching the gate electrode GE.

Next, a high-concentration diffusion region PA is formed in the high-concentration diffusion region NA, the well region PW, and the body region PB located at the bottom of the hole CH by photolithography and ion implantation. Although not shown here, the high-concentration diffused region PA is also formed in the first contact portion SRb and the second contact portion SRc.

Figure 16:
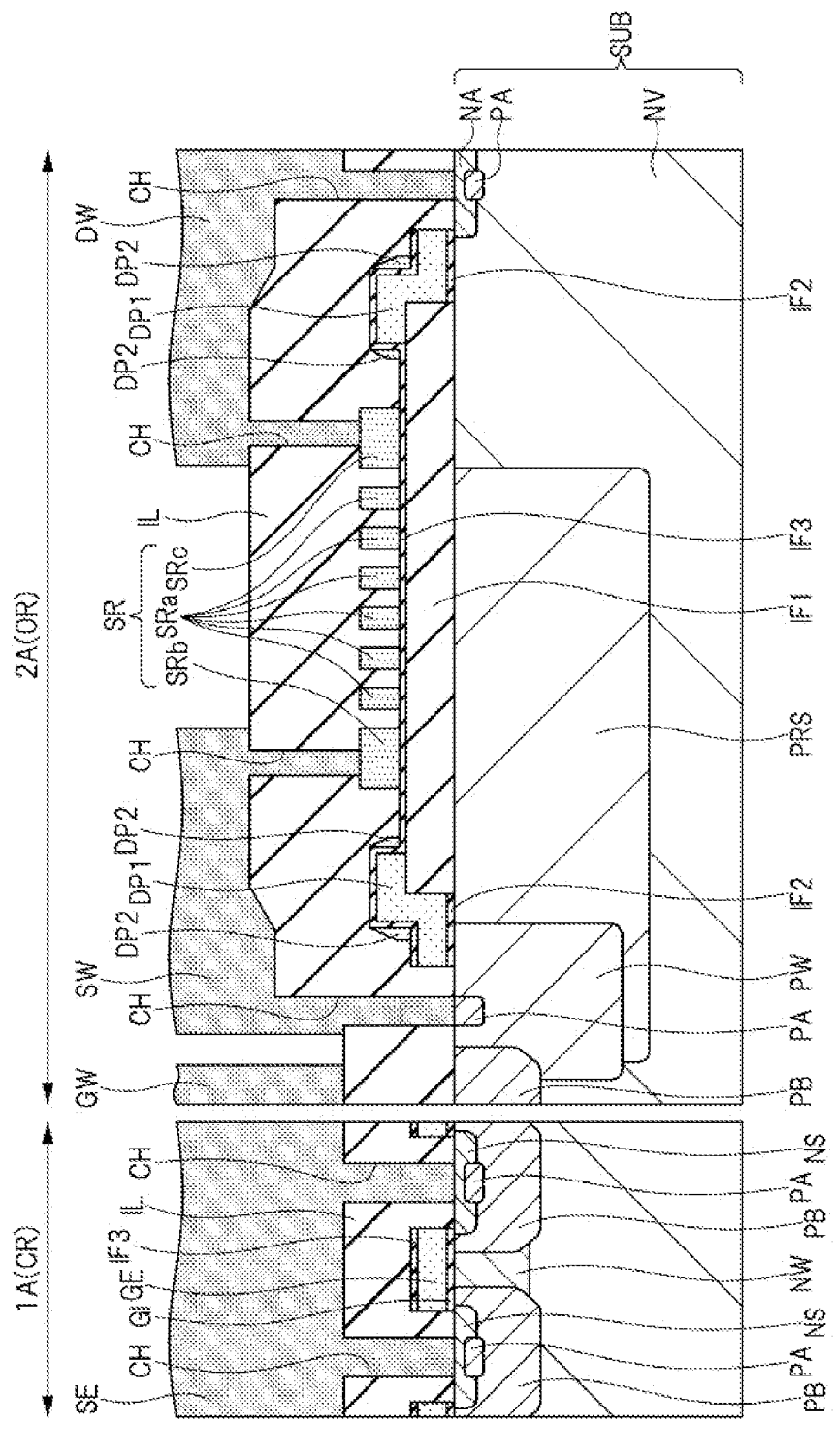
FIG. 16 is a cross-sectional view showing the method of manufacturing the semiconductor device following FIG. 15.

As shown in FIG. 16, the source electrode SE, a gate wiring GE, a source wiring SW, and a drain wiring DW are formed on the interlayer insulating film IL. In order to form these films, first, a stacked film of a barrier metal film made of, for example, a titanium tungsten film or a titanium nitride film and a conductive film made of, for example, an aluminum film is formed on the interlayer insulating film IL by a sputtering method or a CVD method. Next, the stacked film is patterned to form the source electrode SE, the gate wiring GW, the source wiring SW, and the drain wiring DW. The source electrode SE, the gate wiring GW, the source wiring SW, and the drain wiring DW are each embedded in the hole CH.

Thereafter, although not shown here, a protective film made of, for example, a polyimide film is formed on the source electrode SE, the gate wiring GW, the source wiring SW, and the drain wiring DW by, for example, a coating method. A portion of the protective film is opened to expose regions of the source electrode SE and the gate wiring GW that become the source pad and the gate pad.

Thereafter, semiconductor device 100 shown in FIG. 4 is manufactured through the following manufacturing process. First, the lower surface of semiconductor substrate SUB is polished as needed. Next, an n-type drain-region ND is formed by introducing, for example, arsenic (As) or the like into the lower surface of semiconductor substrate SUB by ion-implantation. Next, the drain electrode DE is formed under the lower surface of semiconductor substrate SUB by a sputtering method.

Examined Example and Key Features of First Embodiment

Figure 17:
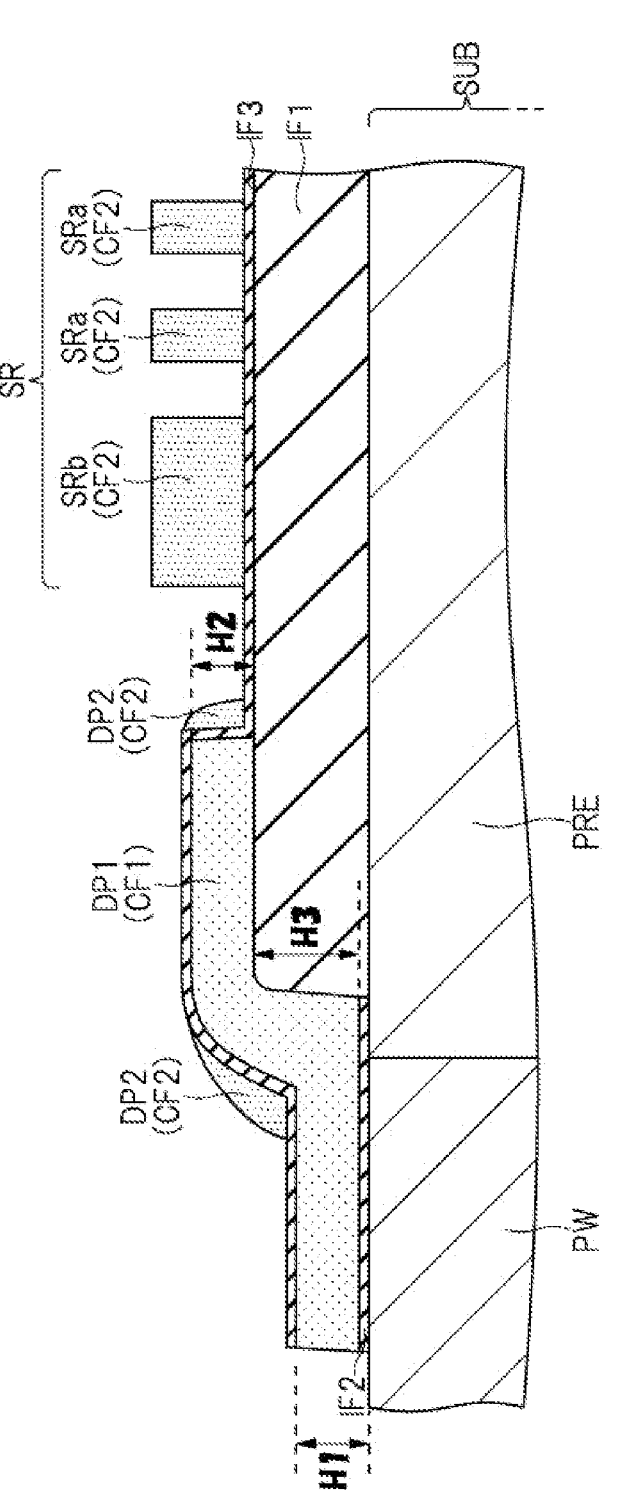
FIG. 17 is an enlarged cross-sectional view of a portion of the semiconductor device according to the first embodiment.
Figure 18:
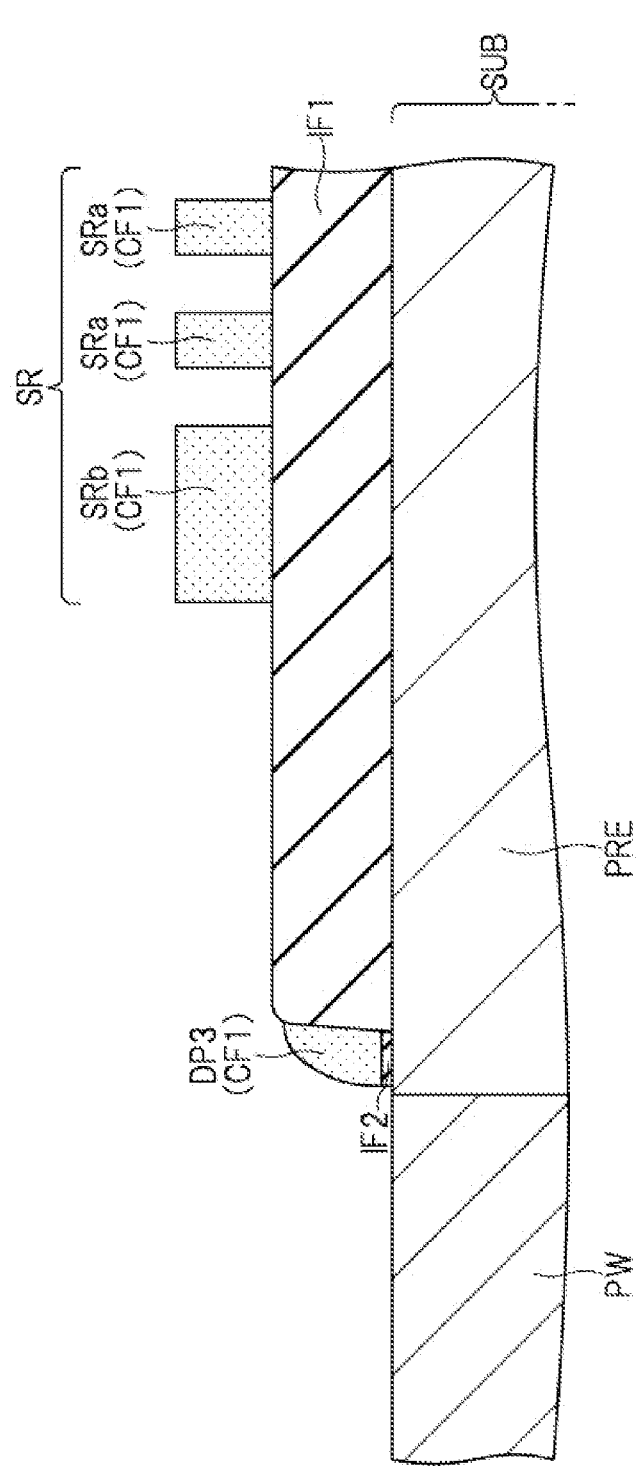
FIG. 18 is an enlarged cross-sectional view of a portion of a semiconductor device according to an examined example.

FIG. 17 is a cross-sectional view showing a structure in the vicinity of the dummy pattern DP1. FIG. 18 is a cross-sectional view of a semiconductor device according to an examined example that the inventor of the present application has studied on the basis of Patent Document 1 and the like. As shown in FIG. 18, in the examined example, unlike the first embodiment, the resistive element SR is formed of a conductive film CF1. In the examined example, the gate electrode GE is also formed of a conductive film CF1.

Since a high-voltage is applied to the resistive element SR, the thickness of the insulating film IF1 is set sufficiently thick so that a tunneling current does not flow through semiconductor substrate SUB. Therefore, the height of the step occurring between the insulating film IF2 and the insulating film IF1 is also very high.

As shown in FIG. 18, when an attempt is made to form the resistive element SR by the conductive film CF1, the conductive film CF1 is processed into a sidewall shape by an anisotropic etching process at the time of patterning, and is left as a dummy pattern DP3 in the step. In the subsequent manufacturing process, a number of cleaning processes are performed, such as before film formation or after removal of the resist pattern. The dummy pattern DP3 is easily peeled off when the insulating film IF1 and the insulating film IF2 in contact with the dummy pattern DP3 are retreated by the cleaning step. Then, the dummy pattern DP3 remains as a foreign matter on semiconductor substrate SUB in the wafer condition, which causes a defect.

In order to completely remove such a dummy pattern DP3, an anisotropic etching process during patterning of the conductive film CF1 may be further continued. However, in the cell region CR, the semiconductor substrate SUB located between the gate electrode GE is also etched, and the semiconductor substrate SUB is scraped. As a result, a problem such as a change in the threshold voltage of the MOSFET 1Q is likely to occur.

In addition, a portion that straddles the step is covered with the resist pattern many times in a subsequent manufacturing process, but if the step is very high, there is also a problem that the resist pattern is easily interrupted in the step when the resist pattern is formed.

In the examined example, since both the gate electrode GE and the resistive element SR are formed by using one (single) conductive film CF1, it is difficult to appropriately set the resistivity required to the resistive element SR when the characteristic of the gate electrode GE is prioritized.

As shown in FIG. 17, in the first embodiment, the gate electrode GE is formed by a conductive film CF1, and the resistive element SR is formed by a conductive film CF2. Therefore, the characteristics of the gate electrode GE and the characteristics of the resistive element SR can be individually set. The resistive element SR is formed so as to have a high resistance in order to reduce a current flowing through the resistive element SR, and a p-type impurity is introduced thereinto. Note that, for example, boron (B) is introduced into the conductive film CF2, and the impurity concentration thereof is about $4.9 \times 10^{-17}$ cm$^{-3}$. For example, phosphorus (P) is introduced into the conductive film CF1, and the impurity concentration is about $5.5 \times 10^{-19}$ cm$^{-3}$.

In the first embodiment, a dummy pattern DP1 is formed over the insulating film IF2 and over the insulating film IF1 so as to cover a step occurring between the insulating film IF2 and the insulating film IF1. As in the dummy pattern DP3 of the examined example, the region where the dummy pattern DP1 contacts the insulating film IF2 and the insulating film IF1 is increased as compared with the case where the dummy pattern DP1 is left in a sidewall shape. Therefore, in the first embodiment, the dummy pattern DP1 is hardly peeled off even when exposed to a number of cleaning steps. Therefore, since the generation of foreign matter can be suppressed, the reliability of semiconductor device 100 can be improved, and a decrease in yield can be suppressed.

When the conductive film CF2 is patterned, a sidewall-shaped dummy pattern DP2 is formed on the side surface of the dummy pattern DP1 formed at a position higher than the insulating film IF1. When the dummy pattern DP2 is peeled off, the dummy pattern DP2 may also be a factor of foreign matter, but in a subsequent manufacturing process, the dummy pattern DP2 is covered with the interlayer insulating film IL. In the meantime, the dummy pattern DP2 is exposed to several cleaning steps, but since the number of cleaning steps is relatively small, there is less possibility that the dummy pattern DP2 is peeled off.

When the conductive film CF1 is deposited, the conductive film CF1 tends to have a gradient toward the insulating film IF1. Further, the gradient is further reduced by the dummy pattern DP2. Therefore, when the resist pattern is formed on the dummy pattern DP1 and the dummy pattern DP2, the coating property of the resist pattern is improved, and the resist pattern is less likely to be interrupted.

Also, the thickness of the conductive film CF1 (dummy pattern DP1) is smaller than the thickness of the insulating film IF1. Therefore, as shown in FIG. 17, both the height H1 of the first step occurring on the semiconductor substrate SUB at between the semiconductor substrate SUB and the dummy pattern DP1 and the height H2 of the second step occurring on the insulating film IF1 at between the insulating film IF1 and the dummy pattern DP1 are lower than the height H3 of the third step occurring between the insulating film IF2 and the insulating film IF1 (namely, "Heights H1 & H2<Height H3").

The height H3 is gradually relaxed by the dummy pattern DP1. In other words, in the examined example, the resist pattern is easily separated due to the height H3. In the meanwhile, in the first embodiment, the resist pattern covers portions at the heights H1, H2 which are lower than the height H3. Since the height H3 controlled by the insulating film IF1 is relaxed, the coating property of the resist pattern is further improved, and the resist pattern is less likely to be separated.

SECOND EMBODIMENT

A semiconductor device according to the second embodiment will be described below with reference to FIG. 19. Note that, in the following description, the different points from the first embodiment will be mainly described, and the description of overlapping points with the first embodiment will be omitted.

Figure 19:
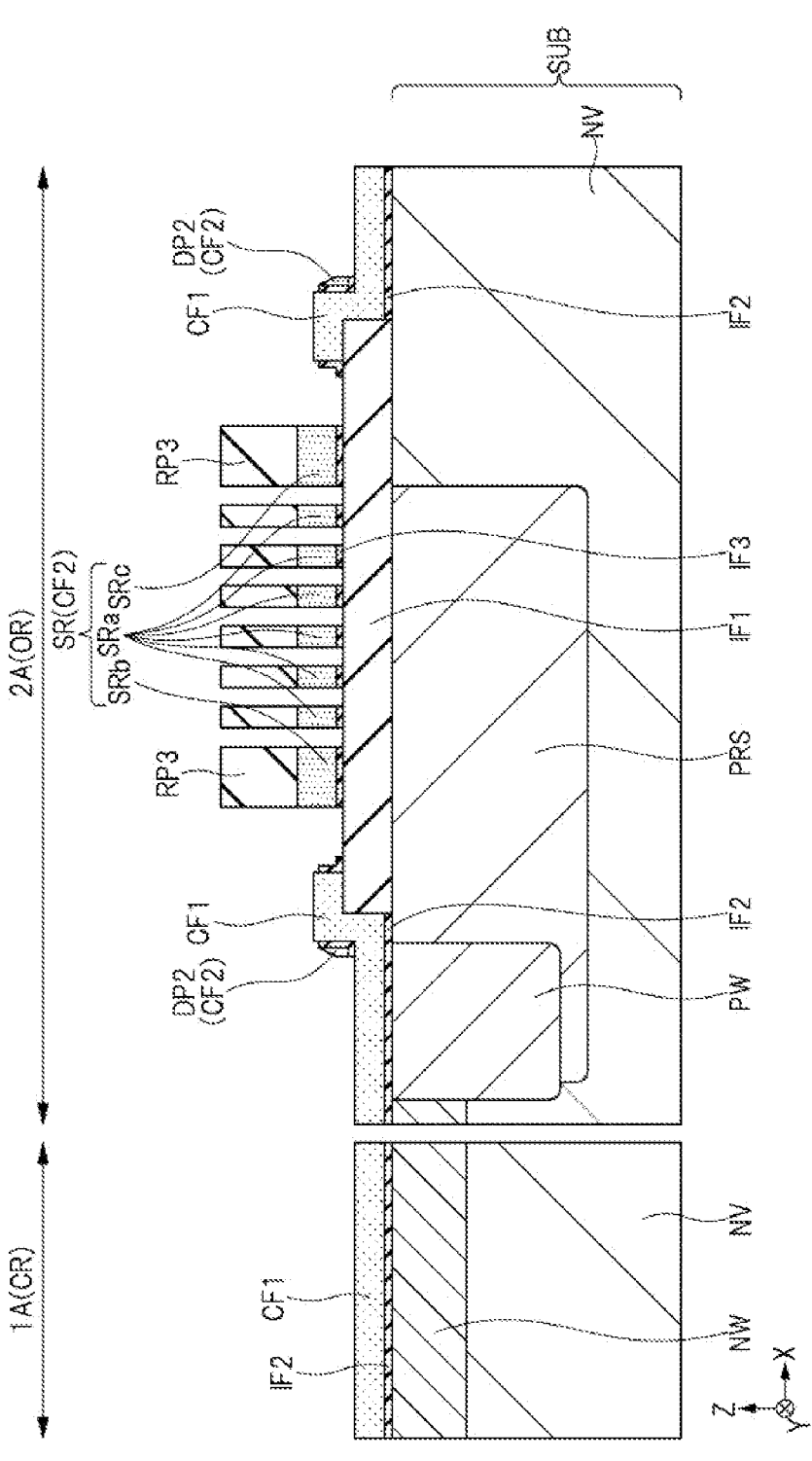
FIG. 19 is a cross-sectional view showing a method of manufacturing the semiconductor device according to a second embodiment.

FIG. 19 shows a manufacturing process following FIG. 11 of the first embodiment. In FIG. 11, the conductive film CF2 is subjected to an anisotropic etching process to form the resistive element SR and a dummy pattern DP2. In the second embodiment, the anisotropic etching process is further continued. Thus, the dummy pattern DP2 is removed.

A plurality of dummy pattern DP2 are formed, but at least a relatively small-size dummy pattern DP2 is removed. That is, as shown in FIG. 19, the dummy pattern DP2 remaining on at least the side surface of the conductive film CF1 located on the insulating film IF1 is removed from the conductive film CF1 formed at a position higher than the insulating film IF1. The anisotropic etching process may continue until all the dummy pattern DP2 have been removed.

As described above, the dummy pattern DP2 is subjected to several cleaning steps until the dummy pattern IL is covered with the interlayer insulating film. Since the number of times is relatively small, the possibility of peeling of the dummy pattern DP2 is small, but at least a part of the plurality of dummy pattern DP2 is removed in the second embodiment in order to reduce the possibility of peeling.

Here, as shown in FIG. 1, the insulating film IF1 having a relatively large thickness is formed so as to surround the cell regions CR, and occupies a relatively large area in the semiconductor substrate SUB in the wafer condition. Therefore, stresses from the insulating film IF1 tend to warp semiconductor substrate SUB in the wafer condition, and various processing accuracy may be lowered.

The anisotropic etching process is performed under conditions where the polycrystalline silicon film (conductive film CF1, CF2) is easily etched and the silicon oxide film (insulating film IF1, IF3) is hardly etched, but the silicon oxide film is also etched little by little while the polycrystalline silicon film is etched. That is, by lengthening the anisotropic etching process, the insulating film IF3 exposed from the resist pattern RP3 is etched.

In particular, when the anisotropic etching process is performed until all the dummy pattern DP2 are removed, the insulating film IF3 is removed, and the insulating film IF1 located below the insulating film IF3 is also etched. As a result, stresses from the insulating film IF1 can be reduced, and warpage of semiconductor substrate SUB in the wafer condition can be reduced.

On the other hand, after the insulating film IF3 is removed, upper surface of the conductive film CF1 is exposed. When the anisotropic etching process is further continued, the conductive film CF1 starts to be etched, and thus the height of the conductive film CF1 decreases. Since the conductive film CF1 in the cell region CR becomes the gate electrode GE, the height of the conductive film CF1 may vary, so that the characteristics of the MOSFET 1Q may vary from desired designs.

Therefore, when a variation in the properties of the MOSFET 1Q is feared, it is desirable to remove the dummy pattern DP2 as much as possible within an extent that the insulating film IF3 is not completely removed. In addition, when the characteristics of the MOSFET 1Q are unlikely to be problematic, it is desirable to perform an anisotropic etching process so that not only the insulating film IF3 but also the insulating film IF1 are etched, with preference given to removing all the dummy pattern DP2 and reducing the warpage of semiconductor substrate SUB in the wafer condition.

Although the present invention has been described in detail based on the above-described embodiments, the present invention is not limited to the above-described embodiments, and can be variously modified without departing from the gist thereof.

What is claimed is:

1. A semiconductor device including a cell region in which a MOSFET is formed and an outer peripheral region surrounding the cell region in plan view, comprising:

a semiconductor substrate of a first conductivity type, the semiconductor substrate having an upper surface and a lower surface;

a first insulating film formed on the upper surface of the semiconductor substrate in the outer peripheral region so as to surround the cell region in plan view; and a resistive element formed on the first insulating film so as to surround the cell region in plan view, wherein a second insulation film having a thickness thinner than a thickness of the first insulation film is formed on the upper surface of the semiconductor substrate in the outer peripheral region, and wherein a first dummy pattern is formed from a portion over the second insulating film to a portion over the first insulating film so as to cover a step occurring between the second insulating film and the first insulating film.

2. The semiconductor device according to claim 1, wherein the first dummy pattern is not electrically connected with each of the MOSFET and the resistive element.

3. The semiconductor device according to claim 1, wherein a second dummy pattern is formed on a side surface of the first dummy pattern, which is formed at a position higher than the first insulating film, via a third insulating film.

4. The semiconductor device according to claim 3, wherein the first dummy pattern and the second dummy pattern are not electrically connected with each of the MOSFET and the resistive element.

5. The semiconductor device according to claim 1, wherein a thickness of the first dummy pattern is thinner than a thickness of the first insulating film.

6. The semiconductor device according to claim 1, wherein the resistive element includes:

a resistance portion formed in a spiral shape;

a first contact portion integrated with the resistance portion and located at an inner side of the resistance portion; and a second contact portion integrated with the resistance portion and located at an outer side of the resistance portion.

7. The semiconductor device according to claim 6, wherein the MOSFET includes:

a gate insulating film formed on the upper surface of the semiconductor substrate in the cell region;

a gate electrode formed on the gate insulating film;

a body region of a second conductivity type opposite the first conductivity type, the body region being formed in the semiconductor substrate in the cell region at a portion located closer to the upper surface than the lower surface; and a source region of the first conductivity type, the source region being formed in the body region, wherein the gate insulating film is made of an insulating film which is the same as the second insulating film, and wherein the gate electrode is made of a conductive film which is the same as the first dummy pattern, and which is different from the resistive element.

8. The semiconductor device according to claim 7, further comprising:

an interlayer insulating film formed on the upper surface of the semiconductor substrate so as to cover the MOSFET in the cell region and to cover the resistive element, the first dummy pattern and the first insulating film in the outer peripheral region;

a first hole formed in the interlayer insulating film and reaching the first contact portion;

a second hole formed in the interlayer insulating film and reaching the second contact portion;

a third hole formed in the interlayer insulating film and reaching the semiconductor substrate in the outer peripheral region;

a fourth hole formed in the interlayer insulating film and reaching the source region;

a fifth hole formed in the interlayer insulating film and reaching the gate electrode;

a source electrode formed on the interlayer insulating film;

a gate wiring formed on the interlayer insulating film and surrounding the source electrode in plan view;

a source wiring formed on the interlayer insulating film, surrounding the gate wiring in plan view, and electrically connected with the source electrode;

a drain wiring formed on the interlayer insulating film and surrounding the source wiring in plan view; and a drain electrode formed on the lower surface of the semiconductor substrate, wherein the source wiring is embedded in the first hole, and electrically connected with the first contact portion, wherein the drain wiring is embedded in each of the second hole and the third hole, and electrically connected with each of the second contact portion and the semiconductor substrate, wherein the source electrode is embedded in the fourth hole, and electrically connected with the source region, and wherein the gate wiring is embedded in the fifth hole, and electrically connected with the gate electrode.

9. The semiconductor device according to claim 1, wherein an impurity of the first conductivity type is introduced into the first dummy pattern, and wherein an impurity of a second conductivity type different from the first conductivity type is introduced into the resistive element.

* * * * *